United States Patent
Liberti et al.

(10) Patent No.: US 11,073,857 B1
(45) Date of Patent: Jul. 27, 2021

(54) MAXIMUM VOLTAGE SELECTOR FOR POWER MANAGEMENT APPLICATIONS

(71) Applicant: NXP B.V., Eindhoven (NL)

(72) Inventors: Domenico Liberti, San Jose, CA (US); Andre Gunther, San Jose, CA (US); Jeffrey Alan Goswick, Phoenix, AZ (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/039,926

(22) Filed: Sep. 30, 2020

(51) Int. Cl.
| | |
|---|---|
| *H03K 19/0185* | (2006.01) |
| *G05F 1/575* | (2006.01) |
| *H03F 3/45* | (2006.01) |
| *H03K 19/20* | (2006.01) |
| *H03K 17/687* | (2006.01) |

(52) U.S. Cl.
CPC .......... *G05F 1/575* (2013.01); *H03F 3/45475* (2013.01); *H03K 17/6871* (2013.01); *H03K 19/018507* (2013.01); *H03K 19/018514* (2013.01); *H03K 19/20* (2013.01)

(58) Field of Classification Search
CPC ............ G05F 1/575; H03K 19/018507; H03K 17/6871; H03K 19/20; H03K 19/018514; H03K 19/018528; H03K 19/018578; H03K 17/687; H03K 17/693; H03F 3/45475
See application file for complete search history.

(56) References Cited

U.S. PATENT DOCUMENTS

| | | |
|---|---|---|
| 5,933,046 A | 8/1999 | Ramet et al. |
| 6,204,721 B1 | 3/2001 | Yuen et al. |
| 6,377,112 B1 | 4/2002 | Rozsypal |
| 7,005,911 B1 | 2/2006 | Om'mani |
| 7,129,766 B2 | 10/2006 | Steinhagen |

(Continued)

OTHER PUBLICATIONS

Na Yan et al., An Improved Charge Pump with High Efficiency for Low Voltage Operations, IEEE 6th International Conference on ASIC, Oct. 24-27, 2005.

(Continued)

*Primary Examiner* — Jung Kim

(57) ABSTRACT

A power supply switching circuit (100) and methodology are disclosed for connecting the greater of first and second power supplies ($V_{SUP1}$, $V_{SUP2}$) to an output voltage node ($V_{OUT}$) with a comparator (102), active power supply switching circuit (103), gate driver circuit (106), and switching array (SW1-SW5) to generate control signals for a pair of PMOS power switches (MP1, MP2) by remapping first and second voltage supplies ($V_{SUP1}$, $V_{SUP2}$) to bias the n-wells of the PMOS power switches while simultaneously driving the gate terminals of the PMOS power switches with the gate driver circuit (106) only in response to a comparator activation signal by generating overlapping phase signals (PHI_1, PHI_2) which controls timing of first and second power supply selection signals so that a ground voltage is supplied as the first power supply selection signal only after the maximum bias voltage is supplied as the second power supply selection signal.

20 Claims, 11 Drawing Sheets

(56) References Cited

U.S. PATENT DOCUMENTS

| | | |
|---|---|---|
| 7,760,007 B2 | 7/2010 | Holzmann |
| 8,164,378 B2 * | 4/2012 | Pietri .................. H03K 5/2472 |
| | | 327/534 |
| 9,082,498 B2 | 7/2015 | Uvieghara et al. |
| 9,444,456 B2 | 9/2016 | Robertson et al. |

OTHER PUBLICATIONS

R. Jacob Baker, CMOS Circuit Design, Layout and Simulation, Third Edition, IEEE Series on Microelectronic Systems, Chapter 27 Nonlinear Analog Circuits, pp. 909-913, 2010.
Vadim V. Ivanov et al, Operational Amplifier Speed and Accuracy Improvement, Analog Circuit Design with Structural Methodology, Chapter 2, pp. 30-31, 2004.

* cited by examiner

US 11,073,857 B1

MAXIMUM VOLTAGE SELECTOR FOR POWER MANAGEMENT APPLICATIONS

BACKGROUND OF THE INVENTION

Field of the Invention

The present invention is directed in general to the field of semiconductor devices. In one aspect, the present invention relates to an n-well biasing circuit for power switch applications.

Description of the Related Art

With metal oxide semiconductor field effect transistors (MOSFETs), a transistor can be modeled as a four terminal component wherein current flow through the transistor is controlled by the relative voltage potentials at four terminals. For a simplified cross-sectional view illustrating a PMOSFET device 10, reference is now made to FIG. 1 which shows that the PMOS device 10 includes a p-type substrate 11 in which is formed an n-well or body 12 connected to a bulk terminal. As formed, the n-well or body 12 includes a P+ source terminal 13, gate terminal 14, P+ drain terminal 15, and N+ bulk terminal 16. Since PMOS transistors are usually symmetrical in structure with respect to its source and drain terminals, either one of the terminals 13, 15 of the PMOS transistor 10 can function as a source or drain terminal, depending on the relative magnitude of the voltages at the respective terminals. In normal operating conditions, in order to prevent currents from flowing in, for example, a PMOS transistor, the gate terminal 14 is biased at a voltage Vg higher than or equal to both the source voltage Vs (at the source 13) and the drain voltage Vd (at the drain 15) (e.g., Vg≥max (Vs, Vd)). At the same time, the intrinsic junction diodes at the source to body junction D1, the drain to body junction D2, and the substrate to body junction D3 are kept reverse biased. In addition, the source of a PMOS transistor is biased more positively with regard to its drain during operation. This positive source voltage can be problematic in that a p-n junction D1 exists between the source and the n-well for the PMOS transistor. If the source is biased sufficiently higher than the n-well, this p-n junction D1 is then a forward-biased parasitic diode which can potentially function as the emitter of a parasitic pnp transistor with surrounding p+ biased at lower voltages. The resulting low ohmic condition in the conducting parasitic structure can create latch-up current that can destroy a circuit or create unintended parasitic currents that destroy the performance of nearby low power circuits. The same situation can happen at the drain terminal, if the drain to n-well voltage is sufficiently high to turn ON the diode D2, and/or at the bulk terminal, if the n-well voltage is sufficiently low to turn ON the diode D3. To prevent the parasitic diodes from turning ON unintentionally, it is necessary to connect the n-well of the device to the highest system voltage.

Even if the circuit can withstand the low ohmic paths through parasitic diodes, latch-up effects can inhibit normal operation. The ON resistance of a reverse body biased PMOS device can significantly increase as compared to a PMOS device without reverse body biasing. To illustrate this effect, reference is now made to FIG. 2 which is a graphical plot 20 of the relative resistance variation ΔR/R of a PMOS switch as a function of reverse body bias $V_{BS}$, where ΔR is the ON resistance variation due to $V_{BS}\neq 0$, and where R is the ON resistance when $V_{BS}=0$. In the depicted example, for a reverse body biasing of 1.8 V, the ON resistance of the PMOS switch can be 70% higher than without reverse body biasing. As a result, if PMOS devices switch between two voltages that are very different, with the n-well of the PMOS devices permanently connected to the highest system voltage, the switch connected to the lower supply would suffer from a very large body effect when in ON state. As the resistance is inversely proportional to the device width (a minimum length is assumed), the area of the PMOS device will also have to be increased by the same factor, which means slower design and higher costs. Latch-up is especially problematic during fast transients.

As seen from the foregoing, there could be design and performance problems that arise from fixedly connecting the well of a transistor to a particular terminal, mainly related with forward biased parasitic diodes and increased channel resistance. If the well is not biased at a voltage equal to the highest between the voltage potentials at the source, drain and substrate terminals, reverse currents may be injected, possibly leading to undesired circuit behavior, including latch-up, or increased channel resistance can deteriorate the performance of the switch.

To solve these and other latch-up related challenges, N-well switching circuits have been developed that switch the n-well potential depending upon the PMOS transistor's voltage mode of operation. When the PMOS transistor is ON, the n-well switching circuit biases the n-well to the same voltage applied to the source terminal. In this fashion, the n-well cannot become forward biased with regard to the PMOS source and drain, since the n-well and source are tied together and n-well to drain junction is slightly reversed biased due to the voltage drop across the channel. This also ensures the lowest channel resistance. When the PMOS transistor is OFF, the n-well switching circuit biases the n-well to the highest system voltage. Again, the n-well cannot become forward biased with regard to any terminal since it is tied to the highest system voltage. Since the potential for the n-well switches between different voltages depending upon the mode of operation, it may be denoted as a switched n-well.

To provide an example of a proposed latch-up solution of tying the n-well of a PMOS transistor to the highest expected voltage, reference is now made to FIG. 3 which depicts a simplified circuit schematic of a cross-coupled bulk switching device 30 wherein a pair of cross-coupled PMOS devices P1, P2 drive each other to connect, respectively, a first voltage supply $V_{SUP1}$ or a second voltage supply $V_{SUP2}$, to an output node $V_{MAX}$. In operation, if the first voltage supply $V_{SUP1}$ is much smaller than the second voltage supply $V_{SUP2}$, then the second PMOS device P2 is turned ON and the first PMOS device P1 is turned OFF so that the output node $V_{MAX}$ is connected to the second voltage supply $V_{SUP2}$ as the higher power supply. The first PMOS device P1 has its n-well connected to the highest voltage at its terminals, so all its parasitic diodes are reverse biased. The second PMOS device P2 has its n-well connected to its drain. Although the voltage at the output node $V_{MAX}$ is slightly lower than $V_{SUP2}$, due to the small voltage drop across the channel of the device P2, all parasitic diodes are reverse biased and the back gate effect on P2 is usually negligible. However, there are performance limitations with the cross-coupled bulk switching device 30. For example, when the voltage supplies $V_{SUP1}$, $V_{SUP2}$ are sufficiently close, then both PMOS devices P1, P2 are turned OFF and the output node $V_{MAX}$ is floating. There can also be charge redistribution problems that arise when a supply voltage increase (e.g., at the first voltage supply $V_{SUP1}$) creates excess charge at the source to n-well capacitor of a PMOS device (e.g., P1), thereby pumping up the voltage at the output node $V_{MAX}$ to a degree that exceeds the process limits and/or causes reliability issues. While this overcharge effect can be attenuated by adding a capacitor between the output node $V_{MAX}$ and ground to prevent voltage overshoot while the load current on the output node $V_{MAX}$ has sufficient time to absorb the charge, this costs additional circuit area and slows down the circuit.

Another example supply switching scheme is illustrated in FIG. 4 which depicts a simplified circuit schematic of a diode-based switching device 40 wherein a pair of diode-connected PMOS devices P1, P2 are connected with a common gate to connect, respectively, a first voltage supply $V_{SUP1}$ or a second voltage supply $V_{SUP2}$, to the output node $V_{MAX}$. In the diode-based switching device 40, only the diode-connected transistor with higher source voltage is ON, and the other one is OFF. In operation, if the first and second voltage supplies $V_{SUP1}$, $V_{SUP2}$ are close enough, both diode-connected transistors P1, P2 are turned ON, creating a relatively low ohmic path between the voltage supplies $V_{SUP1}$, $V_{SUP2}$ and the output node $V_{MAX}$. This results in any load current being sunk from both supplies which can be unacceptable for some applications. In addition, this topology creates a voltage drop between the voltage supplies $V_{SUP1}$, $V_{SUP2}$ and the output node $V_{MAX}$ when current flows.

As seen from the foregoing, the existing solutions for eliminating latch-up effects in MOS transistors and minimizing the channel resistance at the same time while reducing the voltage drop between input and output are extremely difficult at a practical level by virtue of the challenges with efficiently biasing the n-well regions of PMOS devices in systems supplied with separate power supplies that can be exchanged while meeting the performance requirements and cost constraints for fabricating semiconductor devices which avoid the leakage and potential latch-up effects, large body effects, forward biased parasitic diodes, floating outputs, excessive voltage drop, and/or charge redistribution effects, that are associated with conventional well biasing solutions.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
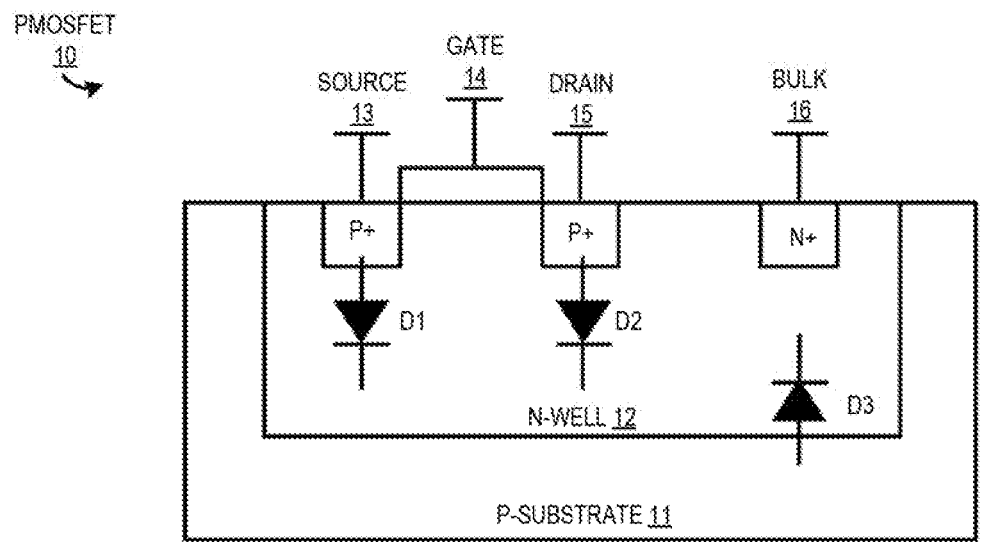
FIG. 1 depicts a simplified cross-sectional view of a PMOS device that includes a p-type substrate and an n-well or body in which are formed source, gate, drain, and bulk terminals.
Figure 2:
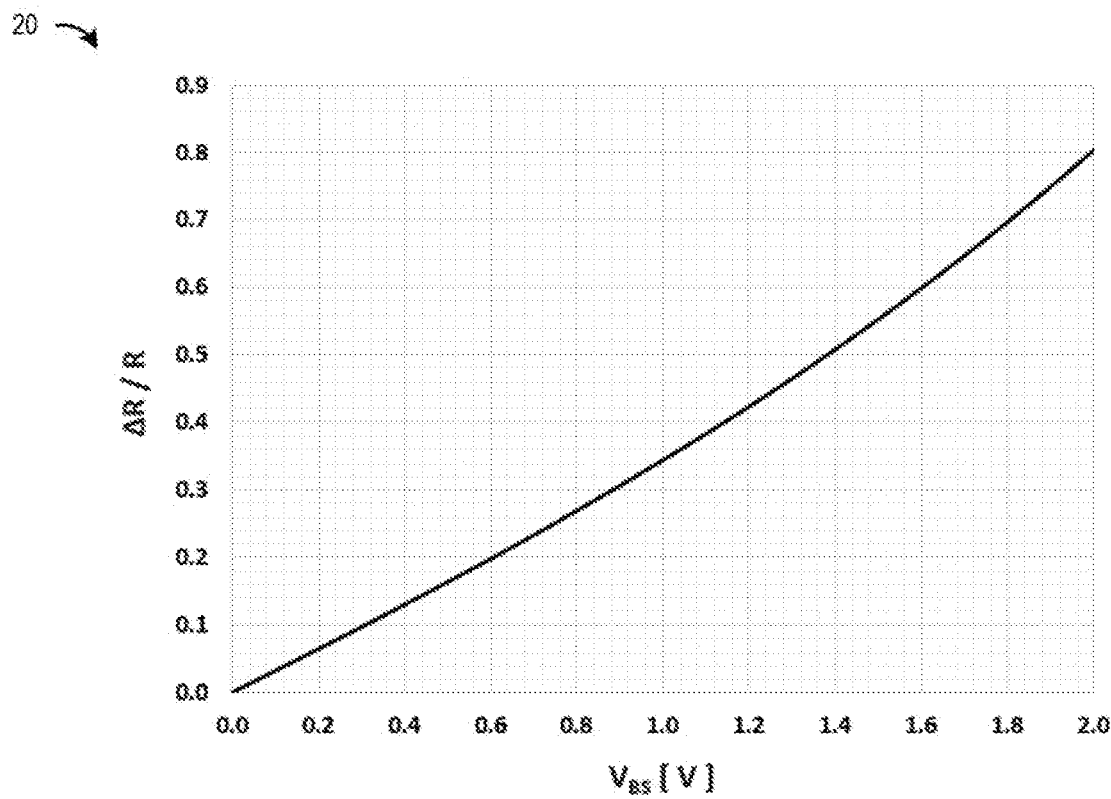
FIG. 2 depicts a graphical plot of the relative resistance variation of a PMOS switch as a function of reverse body bias.

A power supply switching circuit and method are described for biasing a switched n-well of a PMOS power switch by connecting the greater of first and second power supplies $V_{SUP1}$, $V_{SUP2}$ to an output voltage node $V_{OUT}$ with a comparator, active power supply switching circuit, gate driver circuit, and switching array to generate control signals for a pair of PMOS power switches MP1, MP2. As disclosed, first and second voltage supplies $V_{SUP1}$, $V_{SUP2}$ are remapped to bias the n-wells of the PMOS power switches by the active power supply switching circuit while the gate terminals of the PMOS power switches are simultaneously driven by the gate driver circuit only in response to a comparator activation signal which enables the gate driver circuit to generate overlapping phase signals PHI_1, PHI_2 to control the timing of first and second power supply selection signals applied to gate terminals of the PMOS power switches so that a ground voltage is supplied as the first power supply selection signal only after the maximum bias voltage is supplied as the second power supply selection signal. By correctly biasing the n-wells of the PMOS power switches, independently on how close the two power supplies $V_{SUP1}$, $V_{SUP2}$ are, the power supply switching circuit and method avoid forward biased junction diodes, even when one supply is floating or grounded. By remapping the two input voltage supplies in such a way that their difference is the maximum possible, the output of the active power supply switching circuit will never float, even if the two supplies are very close. In addition, the effect of charge redistribution is greatly attenuated, the resistance of the active PMOS device is minimized, the n-well of the inactive PMOS device does not have a forward biased junction so that leakage and potential latch-up is avoided, all without requiring any special fabrication processes (e.g., triple well, native devices, bipolar transistors) above and beyond any bulk CMOS baseline n-well process.

Various illustrative embodiments will now be described in detail with reference to the accompanying figures. As described hereinbelow, the disclosed embodiments can be arranged and designed in a wide variety of different configurations. Thus, the following detailed description of various embodiments, as represented in the figures, is not intended to limit the scope of the present disclosure, but is merely representative of various embodiments. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, the various aspects of the embodiments are presented in drawings that are not necessarily drawn to scale unless specifically indicated. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

Figure 5:
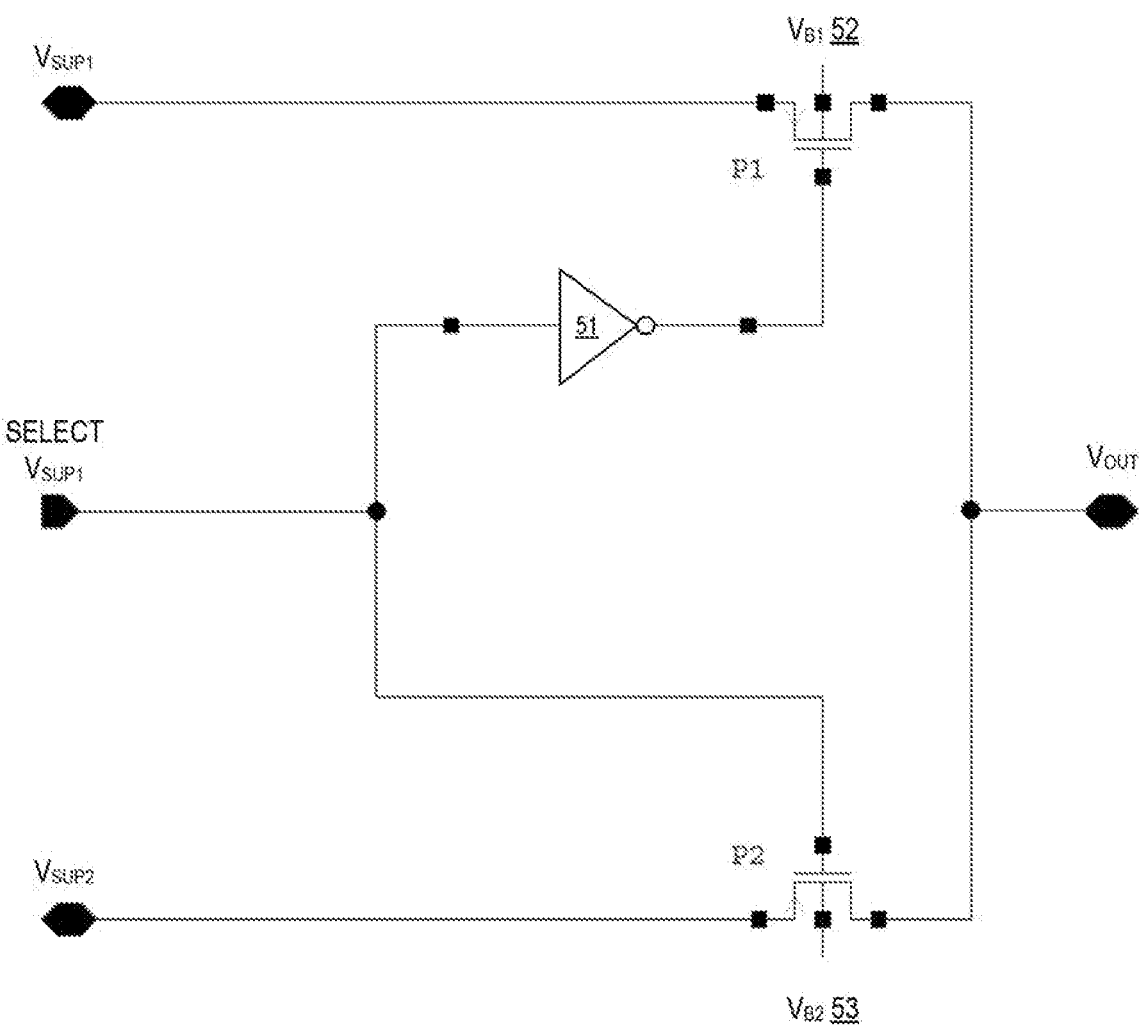
FIG. 5 depicts a simplified circuit schematic of a basic PMOS power switch for connecting an output node to one of two independent voltage supplies.

To provide additional details for an improved contextual understanding of the present disclosure, reference is now made to FIG. 5 which depicts a simplified circuit schematic of a basic PMOS power switch 50 with PMOS devices P1, P2 which are connected to supply an output node $V_{OUT}$ with one of two independent input voltage supplies $V_{SUP1}$, $V_{SUP2}$. In this example, the PMOS devices P1, P2 are each built in their own, separate n-well, and the n-well bias voltages $V_{B1}$ 52 and $V_{B2}$ 53 for the PMOS devices P1, P2 are generated so that the n-well bias voltage $V_B = V_S$ for the ON switch, and so that the n-well bias voltage $V_B = \max(V_S, V_D)$ for the OFF switch. In addition, either of the independent input voltage supplies $V_{SUP1}$, $V_{SUP2}$ can be larger than the other. As illustrated, a first input voltage supply $V_{SUP1}$ is source-drain connected across the first PMOS device P1 to the output node $V_{OUT}$ under control of an inverted selection signal that is generated by the inverter 51 from the input selection signal SELECT $V_{SUP1}$. In addition, a second input voltage supply $V_{SUP2}$ is source-drain connected across the second PMOS device P2 to the output node $V_{OUT}$ under control of the input selection signal SELECT $V_{SUP1}$. In operation, if the input selection signal SELECT $V_{SUP1}$ is high, then the PMOS device P1 is ON and the PMOS device P2 is OFF, thereby connecting the output node $V_{OUT}$ to the first input voltage supply $V_{SUP1}$. However, if the input selection signal SELECT $V_{SUP1}$ is low, then the output node $V_{OUT}$ is connected to the second input voltage supply $V_{SUP2}$.

To illustrate the effects from all possible n-well bias voltage connections, consider first the example where the bulk of each PMOS device P1, P2 is connected to its own source (e.g., $V_{B1} = V_{SUP1}$ and $V_B = V_{SUP2}$). In this case, if the PMOS device connected to the higher input voltage supply is ON, then the drain to n-well junction of the other PMOS device will be forward biased.

In another example, consider the case where the bulks of both PMOS devices P1, P2 are connected to the first input voltage supply $V_{SUP1}$ (e.g., $V_{B1} = V_{B2} = V_{SUP1}$). In this case, when $V_{SUP1} < V_{SUP2}$, the source to n-well junction of the second PMOS device P2 is always forward biased, no matter which PMOS device is ON. And if the second PMOS device P2 is ON, then the drain to n-well junction of both PMOS devices P1, P2 will be forward biased. In addition, when $V_{SUP1} > V_{SUP2}$, if the second PMOS device P2 is ON, there will be a back-gate effect on the second PMOS device P2. Due to symmetry, the statements above are still valid if indexes 1 and 2 are exchanged, as well as words "first" and "second".

In yet another example, consider the case where the bulks of both PMOS devices P1, P2 are connected to the output node $V_{OUT}$ (e.g., $V_{B1} = V_{B2} = V_{OUT}$). In this case, if the PMOS device connected to the lower supply is ON, then the source to n-well junction of the other PMOS device is forward biased.

As seen from the foregoing, the generation of non-optimal n-well bias voltages $V_{B1}$ 52 and $V_{B2}$ 53 for the PMOS devices P1, P2 in the PMOS power switch 50 may cause back gate effects if source to n-well diode is reverse biased. In addition or in the alternative, non-optimal n-well bias voltages $V_{B1}$ 52 and $V_{B2}$ 53 may cause leakage and potential latch-up if source/drain to n-well diodes are forward biased. To address these problems and others, there is disclosed herein a control switching circuit for generating optimal n-well bias voltages by connecting the bulk terminal Vu of the PMOS devices P1, P2 to the respective source or drain terminal in an efficient way to correctly bias the n-well of PMOS devices P1, P2, independently on how close the two input voltage supplies are.

In selected embodiments, optimal n-well bias voltages may be generated from input voltage supplies $V_{SUP1}$, $V_{SUP2}$ using a control switching circuit which includes a simple comparator which is connected and configured to detect the higher between two input voltage supplies $V_{SUP1}$, $V_{SUP2}$, and to output control signals to a pair of level shifters which are connected and configured to re-map the input voltage supplies $V_{SUP1}$, $V_{SUP2}$ into bulk supply voltages for the PMOS devices by not changing the higher input voltage supply and by converting the lower input voltage supply to ground. Through this re-mapping, the difference between the input supply voltages is maximized for purposes of biasing the n-wells in the PMOS device P1, P2, thereby making it easier and safer to drive the cross-coupled PMOS devices. In particular, the control switching circuit generates the output node $V_{MAX}$ for connection to bias the n-well of the PMOS device in the OFF state so that all of its diodes are reverse biased, thereby avoiding leakage and potential latch-up. In addition, the control switching circuit may include additional control switches which connect the n-well of the PMOS device in the ON state to its source, thereby minimizing the back-gate effect and allowing the use of a smaller PMOS device.

Figure 6:
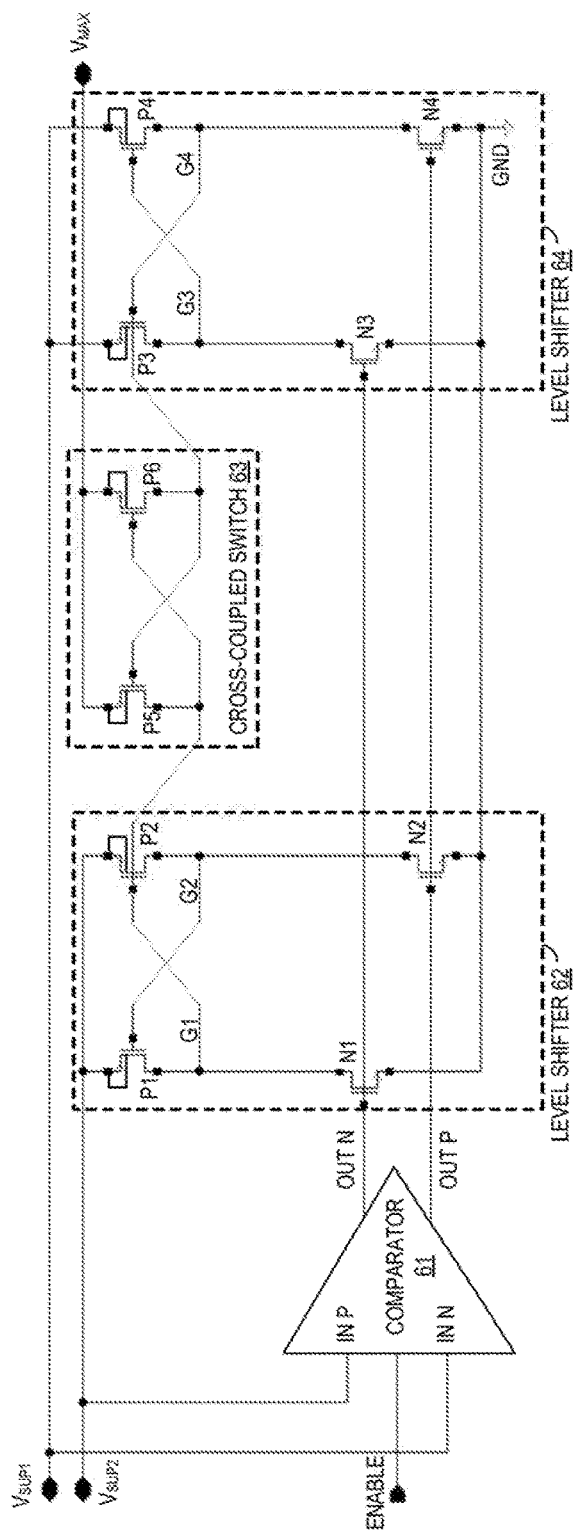
FIG. 6 depicts a simplified circuit schematic of an active N-well switching circuit for a PMOS power switch which uses a comparator with two level shifters to remap first and second independent voltage supplies to bias the n-well of a PMOS power switch in accordance with selected embodiments of the present disclosure.

For an improved understanding of selected embodiments of the present disclosure, reference is now made to FIG. 6 which depicts a simplified circuit schematic of an active N-well switching circuit 60 for a PMOS power switch which uses a comparator 61 with two level shifters 62, 64 and a cross-coupled switch 63 to remap first and second independent voltage supplies $V_{SUP1}$, $V_{SUP2}$ to bias the n-well of a PMOS power switch. Generally speaking, the comparator 61 generates output signals OUT N, OUT P which are connected to drive the gates of NMOS transistors N1-N4 in the first and second level shifters 62, 64. In turn, each level shifter 62, 64 is connected to a corresponding gate driving node G1, G4 in the cross-coupled switch 63 to provide a level shifting function from the comparator output level to voltage supplies $V_{SUP2}$, $V_{SUP1}$, respectively. As depicted, the level shifters 62, 64 may use a configuration of MOS devices N1-N4, P1-P4 to provide a basic level shifting function from the comparator output level to $V_{SUP2}$, $V_{SUP1}$, respectively. However, it will be appreciated that any suitable level shifter circuit can be connected between the input supply voltages $V_{SUP1}$, $V_{SUP2}$. As a result of the level-shifted gate driving nodes, the cross-coupled switch 63 can use the cross-coupled PMOS devices P5, P6 to drive the output node $V_{MAX}$ to either the first voltage supply $V_{SUP1}$ or second voltage supply $V_{SUP2}$, whichever is higher. This outcome is achieved even when the voltage supplies are close to one another by virtue of the remapping function provided by the comparator 61 and level shifters 62, 64 which effectively convert to ground the lower supply voltage that is supplied to the cross-coupled switch.

Figure 4:
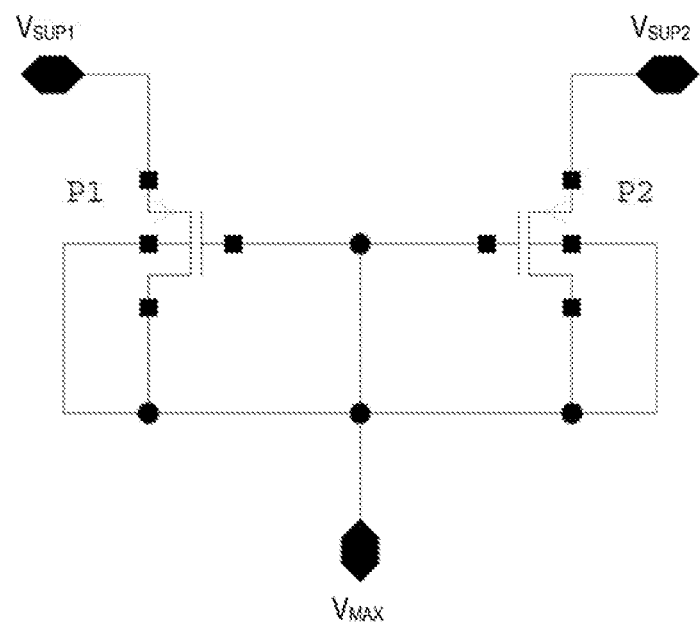
FIG. 4 depicts a simplified circuit schematic of a diode-based switching device wherein a pair of diode-connected PMOS devices are connected with a common gate to connect, respectively, a first voltage supply $V_{SUP1}$ or a second voltage supply $V_{SUP2}$, to the output node $V_{MAX}$.

As depicted, the comparator 61 may be connected to receive an input signal ENABLE which enables the comparator 61 to detect which of the independent voltage supplies $V_{SUP1}$, $V_{SUP2}$ is higher and to output corresponding output signals. For example, when the first voltage supply $V_{SUP1}$ is larger than the second voltage supply $V_{SUP2}$ by at least the comparator offset value, the comparator 61 may generate a first output signal (OUT N) that is HIGH and a second output signal (OUT P) that is LOW. Similarly, when the second voltage supply $V_{SUP2}$ is larger than the first voltage supply $V_{SUP1}$ by at least the comparator offset value, the comparator 61 may generate the first output signal (OUT N) that is LOW and the second output signal (OUT P) that is HIGH. Though not shown, the comparator 61 may be supplied by the first voltage supply $V_{SUP1}$, though it will be appreciated that the circuit works in the same if the comparator 61 is supplied by the second voltage supply $V_{SUP2}$. In other embodiments, the comparator 61 may be supplied by a diode-based switching device, such as depicted in FIG. 4. The only constraint is that the supply voltage of the output stage of the comparator 61 should be sufficiently higher than one NMOS threshold voltage, so that the NMOS devices N1, N2, N3 and N4 can be properly driven.

As will be appreciated, the accuracy of the active N-well switching circuit 60 is limited by the offset of the comparator 61. In other words, the right decision is made if the absolute value of the difference of the two input voltage supplies $V_{SUP1}$, $V_{SUP2}$ is greater than the offset of the comparator (which is in the order of millivolts). However, even a wrong decision of the comparator does not affect the functionality of the whole system, since all parasitic diodes are still turned OFF and there is negligible back-gate effect caused by a comparator offset of a few millivolts.

In the depicted level shifters 62, 64 and cross-coupled switch 63, each PMOS device P1-P6 has its n-well connected to the source of the same device. In particular, the n-wells of the PMOS devices P1, P2 in the first level shifter 62 are connected to $V_{SUP2}$. In addition, the n-wells of the PMOS devices P3, P4 in the second level shifter 64 are connected to $V_{SUP1}$. Finally, the n-wells of the PMOS devices P5, P6 in the cross-coupled switch 63 are connected to $V_{MAX}$. In this configuration, all source/drain to n-well junctions of the PMOS devices P1-P6 are always reversed biased or not biased ($V_{BS}=0$) and there is no back-gate effect for any configuration of $V_{SUP1}$ and $V_{SUP2}$. As will be appreciated, the requirement of three different n-well regions imposes a size cost in circuit area. However, in other embodiments (not shown), this size cost can be reduced by connecting each of the PMOS n-wells to the output node $V_{MAX}$.

Figure 3:
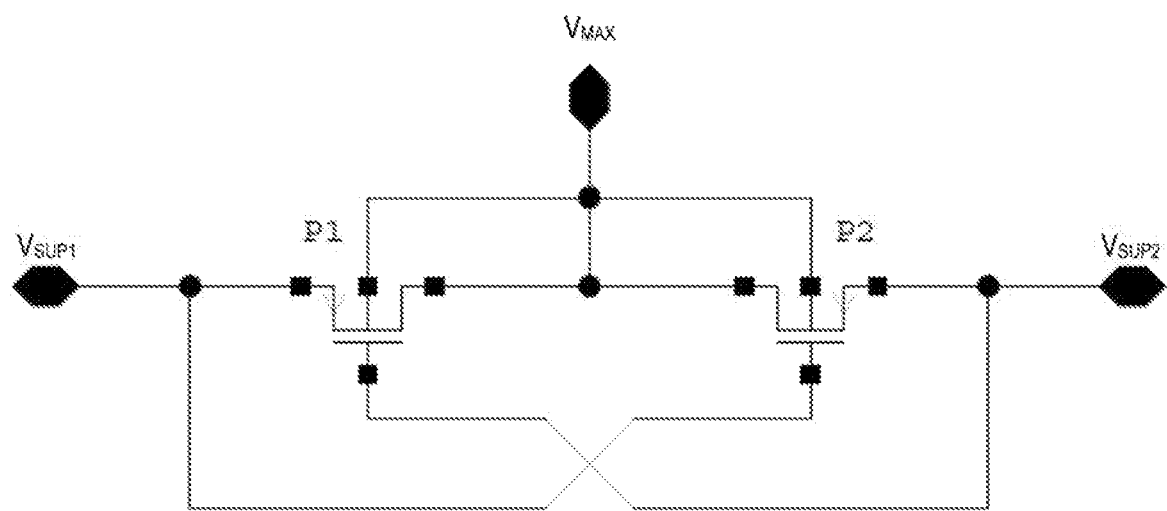
FIG. 3 depicts a simplified circuit schematic of a cross-coupled bulk switching device wherein a pair of cross-coupled PMOS devices drive each other to connect, respectively, a first voltage supply $V_{SUP1}$ or a second voltage supply $V_{SUP2}$, to an output node $V_{MAX}$.

To illustrate the operation of the active N-well switching circuit 60, consider the example of a first input voltage supply $V_{SUP1}$ that is higher than the second input voltage supply $V_{SUP2}$, by only 10-20 mV—a condition that would result in the output node $V_{MAX}$ being a floating node if the circuit in FIG. 3 is used. Without loss of generality, the comparator 61 can be supplied by the first input voltage supply $V_{SUP1}$, though the active N-well switching circuit 60 works the same if the comparator 61 is supplied by the second input voltage supply $V_{SUP2}$. In the case where $V_{SUP1}>(V_{SUP2}+|\text{comparator offset}|)$, then the first output signal (OUT N) from the comparator 61 is HIGH and the second output signal (OUT P) is LOW, which means the NMOS devices N1, N3 are ON, and the NMOS devices N2, N4 are OFF. In this scenario, the NMOS device N1 in the first level shifter 62 ties the gate driving node G1 to ground (GND), causing the PMOS device P2 in the first level shifter 62 to turn ON. With the second output signal (OUT P) turning the NMOS device N2 in the first level shifter 62 OFF, the gate driving node G2 is pulled up to $V_{SUP2}$ (across the PMOS device P2), which in turns shuts the PMOS device P1 OFF. As a result, no DC current flows through the NMOS devices N1, N2 and PMOS devices P1, P2 of the first level shifter 62. In the second level shifter 64, the circuit operations are mirrored. In particular, the first output signal (OUT N) from the comparator 61 turns ON the NMOS device N3 from the second level shifter 64 which ties the gate driving node G3 to ground (GND), the PMOS device P4 turns ON and, as the NMOS device N4 is OFF, the gate driving node G4 goes up to the first input voltage supply $V_{SUP1}$, which in turns shuts the PMOS device P3 OFF so that no DC current flows through the NMOS devices N3, N4 and PMOS devices P3, P4 of the second level shifter 64.

The results of the level shifting at the gate driving nodes G1, G4 on the PMOS devices P5, P6 of the cross-coupled switch 63 are to connect the gate of the PMOS device P5 (via G4) to the first input voltage supply $V_{SUP1}$ so that the PMOS device P5 is turned OFF, while the gate of the PMOS device P6 is connected (via G1) to ground (GND) so that the PMOS device P6 is turned ON. In this way, the independent input voltage supplies $V_{SUP1}$, $V_{SUP2}$ have then been re-mapped, respectively, via G4 to $V_{SUP1}$ (unchanged) and via G1 to ground (GND). Through this re-mapping, the higher between the two input voltage supplies $V_{SUP1}$, $V_{SUP2}$ does not change, but the lower is converted to ground. As a result of the re-mapping, the PMOS devices P5, P6 in the cross-coupled switch 63 see two very different values, even though the input voltage supplies $V_{SUP1}$, $V_{SUP2}$ are very close. This results from the first level shifter 62 tying the gate driving node G1 to ground so that the PMOS device P6 is turned ON, while the second level shifter 64 connects the gate driving node G4 to the (higher) input voltage supply $V_{SUP1}$ to shut the PMOS device P5 OFF. As a result, the activated the PMOS device P6 connects the output node $V_{MAX}$ to the gate driving node G4=$V_{SUP1}$, which is the higher of the two supplies.

As will be appreciated, the active N-well switching circuit 60 works in the same way when the second input voltage supply $V_{SUP2}$ exceeds the first input voltage supply $V_{SUP1}$ by at least the comparator offset value. However, in applications where one of the input voltage supplies is always higher than the other, the active N-well switching circuit 60 may use a single level shifter. For example, if $V_{SUP1} > V_{SUP2}$, the second level shifter 64 can be used, provided the gate of the PMOS device P6 is grounded.

In cases where the difference between the input voltage supplies $V_{SUP1}$, $V_{SUP2}$ is less than the comparator offset, the comparator 61 might make the wrong decision. In the example where the input voltage supply $V_{SUP1}$ is larger but $|V_{SUP1} - V_{SUP2}| < |$comparator offset$|$, this means that the first output signal (OUT N) from the comparator 61 would be LOW and the second output signal (OUT P) would be HIGH, in which case $V_{SUP2}$ is presented at the output node $V_{MAX}$. While this output is incorrect, this is harmless for both back-gate effect and reverse biased junctions since their effects are de minimus, being the comparator offset in the order of some millivolts.

In addition to addressing the back-gate effects and current leakage from parasitic diodes, the disclosed active N-well switching circuit 60 also addresses the charge redistribution problem that arises when one input voltage supply is fixed and the other varies. This may be illustrated with reference to the example scenario where the first input voltage supply is higher than the second input voltage supply ($V_{SUP1} > V_{SUP2}$). In this case, the charged stored across the drain to n-well junction of the PMOS device P5 is $$Q_{P5,IN} = C_{BD,P5} \cdot V_{SUP1}$$

and the charge stored across the drain to n-well junction of the PMOS device P6 is $$Q_{P6,IN} = 0.$$

If the second input supply voltage $V_{SUP2}$ rises, the comparator 31 toggles when $V_{SUP2} = V_{SUP1} + V_{C,OF}$, where $V_{C,OF}$ is the offset of the comparator 61. In this new configuration, the charge stored across the junction capacitors are:

$$Q_{P5,FIN} = 0$$

$$Q_{P6,FIN} = C_{BD,P6} \cdot V_{SUP2}$$

As a result, the charges then change by the following amount:

$$\Delta Q_{P5} = Q_{P5,FIN} - Q_{P5,IN} = -C_{BD,P5} \cdot V_{SUP1}$$

$$\Delta Q_{P6} = Q_{P6,FIN} - Q_{P6,IN} = C_{BD,P6} \cdot V_{SUP2} = C_{BD,P6} \cdot [V_{SUP1} + V_{C,OF}]$$

In cases where the PMOS devices P5, P6 have the same size, then $C_{BD,P5} = C_{BD,P6} = C_{BD}$. As a result, the charge redistribution may be computed as $\Delta Q_{P6} - \Delta Q_{P5}$ which is the excess charge released from the PMOS device P5 that is not caught by the PMOS device P6, resulting in the small amount, $\Delta Q_{P6} - \Delta Q_{P5} = C_{BD} \cdot V_{C,OF}$. Provided that the offset $V_{C,OF}$ at the comparator 61 is on the order of some millivolts, the overshoot at the output node $V_{MAX}$ is absolutely negligible, and may be further attenuated by a small load capacitor (not shown) connected to the output node $V_{MAX}$. Such a capacitance will also help attenuate the effect of unavoidable delays in the active N-well switching circuit 60. For most applications, the n-well to substrate capacitance of the devices connected to the output node $V_{MAX}$ might be sufficient that a load capacitor might not be needed.

As will be appreciated, the active N-well switching circuit 60 effectively remaps the excess overshoot charge to an amount ($C_{BD} \cdot V_{C,OF}$) that is independent of the input voltage supplies, in contrast the switching device examples of FIGS. 3-4 which can generate overshoot charge ($-C_{BS,P1} \cdot V_{SUP1}$) that depends on the input voltage supply. In particular and with reference to the scheme in FIG. 3 where it is assumed that $V_{SUP1} = 0$ and $V_{SUP2}$ is constant, the cross-coupled bulk switching device 30 generates an output voltage $V_{MAX} = V_{SUP2}$ and the source to n-well capacitor of PMOS device P1 stores a charge $Q_{P1,IN} = C_{BS,P1} \cdot V_{SUP2}$. When the first input voltage supply $V_{SUP1}$ rises, the charge across the same capacitor is $Q_{P1,FIN} = C_{BS,P1} \cdot [V_{SUP2} - V_{SUP1}]$. Thus, the excess charge $\Delta Q_{P1}$ that redistributes to pump up the voltage at the node $V_{MAX}$ is $\Delta Q_{P1} = Q_{P1,FIN} - Q_{P1,IN} = -C_{BS,P1} \cdot V_{SUP1}$. As seen from the foregoing, the overshoot due to charge redistribution from the active N-well switching circuit 60 is attenuated by a factor $$\frac{V_{C,OF}}{Sup1},$$

which can easily be in the order of 0.01 or less.

As disclosed herein, the comparator 61 may be implemented with any suitable comparison circuit for evaluating which of the input voltage supplies $V_{SUP1}$, $V_{SUP2}$ is larger. For example, a self-biased, NMOS input, folded cascode architecture can be used for the comparator 61 which makes the whole system independent from external support blocks, such as a bias current generator. Of course, a simpler comparator can be used for other applications if a bias current is available. As described above, comparator offset and speed are not critical points in this design, so virtually any kind of comparator can be used.

Figure 7:
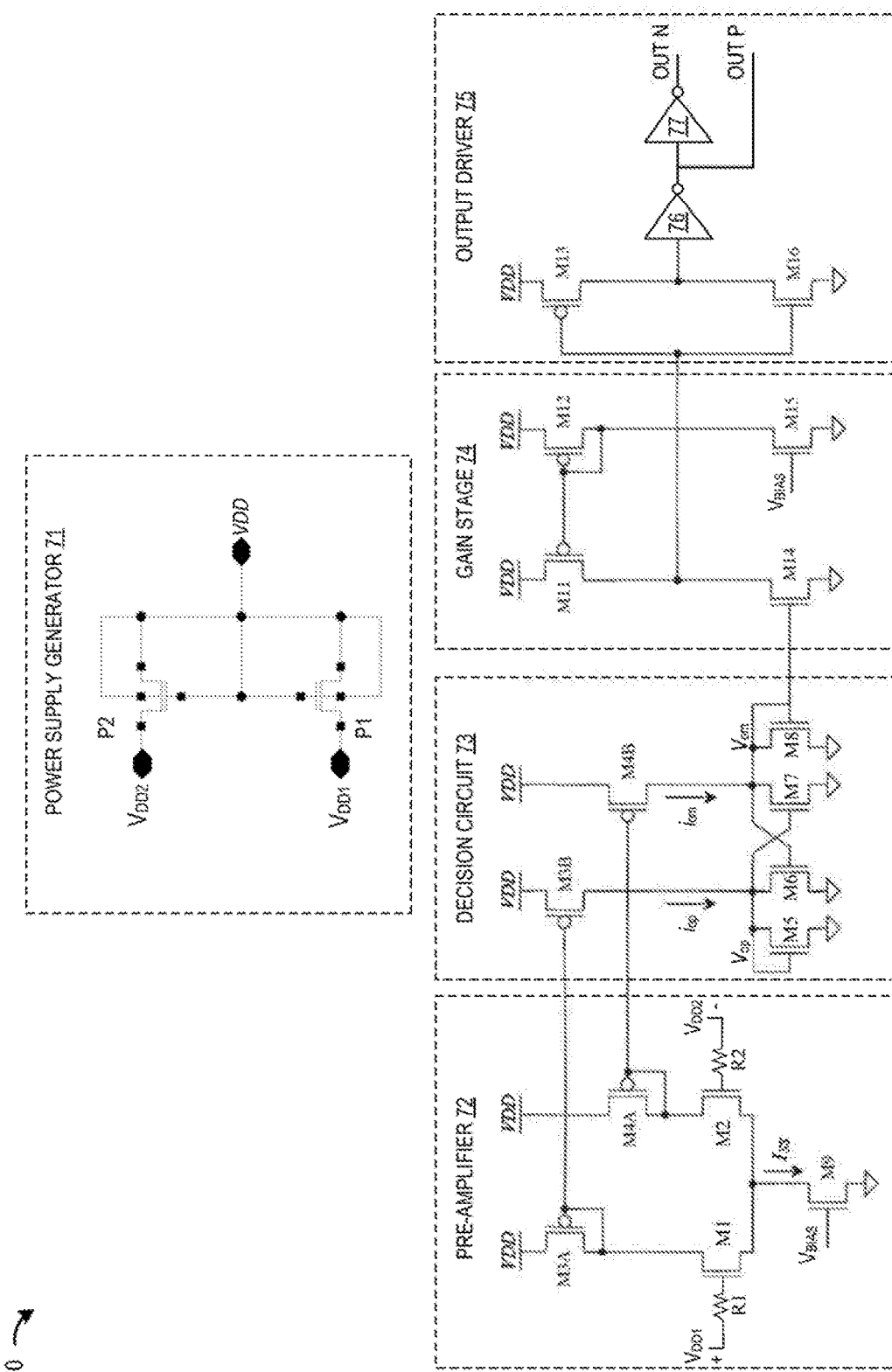
FIG. 7 depicts a simplified circuit schematic of a multi-stage comparator for detecting the higher supply voltage in accordance with selected embodiments of the present disclosure.

To provide additional details for an improved contextual understanding of the present disclosure, reference is now made to FIG. 7 which depicts a simplified circuit schematic of a high-performance multi-stage comparator 70 for detecting the higher supply voltage and generating corresponding comparator output signals OUT N, OUT P. Generally speaking, the comparator 70 includes a power supply generator stage 71, pre-amplifier stage 72, decision circuit stage 73, gain stage 74, and output driver stage 75 which are connected to generate output signals OUT N, OUT P which drive the level shifters (not shown).

As will be appreciated, any suitable design may be used for the power supply generator 71 to provide the supply voltage VDD to the comparator 70. In the depicted, example, the power supply generator 71 includes a pair of diode-connected transistors P1, P2 connected as depicted in FIG. 4 to generate the output supply voltage VDD from the input voltage supplies $V_{DD1}$, $V_{DD2}$. However, other circuits can be used to provide the supply voltage VDD to the other stages 72-75 of the comparator 70.

At the input pre-amplifier stage 72, the difference of the input power supply signals $V_{DD1}$, $V_{DD2}$ is amplified to improve the sensitivity of the comparator 70 (i.e., increase the minimum input signal with which the comparator can make a decision) and to isolate the input of the comparator 70 from switching noise (often called kickback noise) coming from the positive feedback or decision stage 73. As depicted, the input pre-amplifier stage 72 may be implemented with NMOS devices M1, M2, M9 and PMOS devices M3A, M4A connected as a differential amplifier circuit with PMOS devices M3B, M4B to provide an active load and no high impedance internal nodes in order to ensure high speed when generating amplified output currents $i_{op}$, $i_{on}$ which correspond to the input voltages $V_{DD1}$, $V_{DD2}$. Two small resistors R1, R2 may be provided at the inputs protect the gates of the NMOS devices M1, M2, as the input voltages of the comparator are the two power supplies $V_{DD1}$, $V_{DD2}$. The input voltages $V_{DD1}$, $V_{DD2}$ relate to the output currents $i_{op}$, $i_{om}$ with the equation $i_{op}=(V_{DD1}-V_{DD2})g_m/2+Iss/2=Iss-i_{om}$. As a result, if $V_{DD1}>V_{DD2}$, then $i_{op}$ is positive and $i_{om}$ is negative ($i_{op}=-i_{om}$). In selected embodiments, input down level shifters (not shown) may be included at the gate of the NMOS devices MN1 and MN2 to accommodate the input range.

At the decision circuit stage 73, the comparator 70 determines which of the input signals $i_{op}$, $i_{om}$ generated by the PMOS devices M3B, M4B is larger by feeding the input signals $i_{op}$, $i_{om}$ to the cross-gate connection of the cross-coupled NMOS devices M6, M7. The decision circuit stage 73 is capable of discriminating millivolt-level signals, thanks to the positive feedback from the cross-gate connections of M6 and M7, and should be capable of rejecting noise on the signal by adding hysteresis by changing the ratio between the cross-coupled devices M6-M7 and the diode-connected NMOS devices M5, M8 to the left and right end sides of the stage.

At the gain stage 74, the output from the decision circuit stage 73 is amplified using any suitable amplification circuit. In the depicted, example, the gain stage 74 may be implemented with PMOS devices M11, M12 and NMOS devices M14, M15 connected in a common source circuit. In addition, the output driver stage 75 is provided with a first inverter circuit (e.g., PMOS device M13 and NMOS device M16) connected in series with one or more inverters 76-77 to receive an input from the gain stage 74 and to generate complementary digital output signals OUT N, OUT P which are squared and capable to drive capacitive loads.

Figure 8:
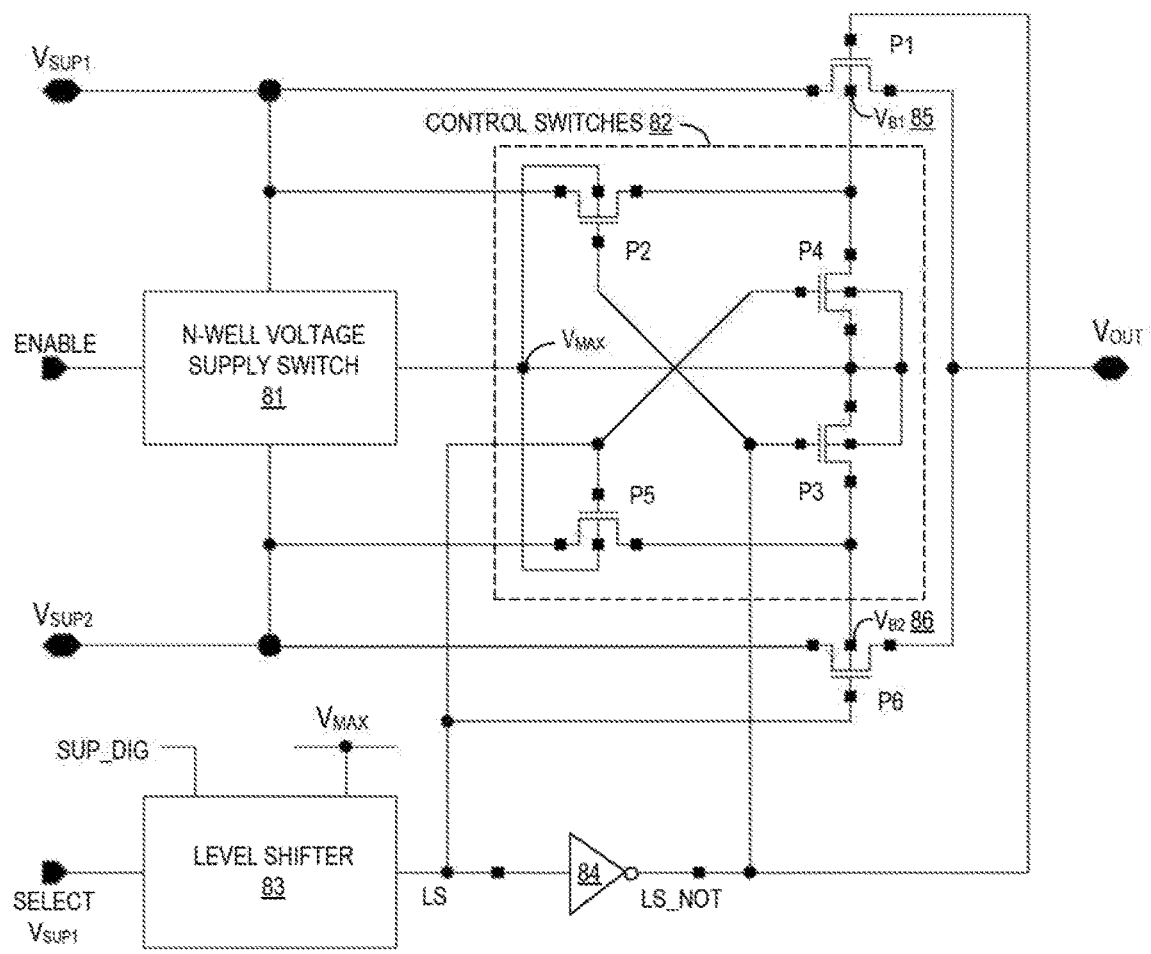
FIG. 8 which depicts a simplified circuit schematic of a PMOS power switch system which includes an active n-well voltage supply switching circuit that is connected over control switches to a pair of PMOS power switch devices in accordance with selected embodiments of the present disclosure.
Figure 9:
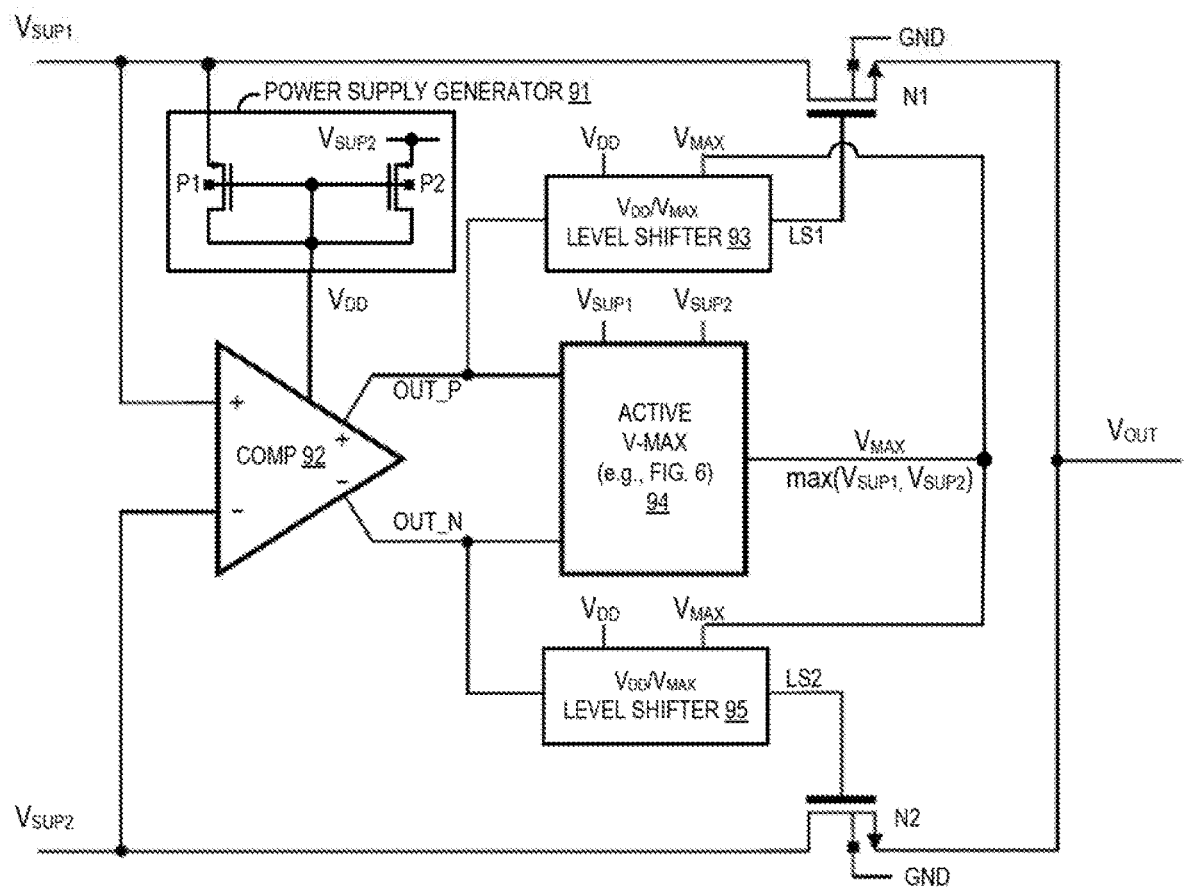
FIG. 9 depicts a simplified block diagram of an NMOS power switch system which includes an active power supply switching circuit for generating a gating control signal for a pair of native NMOS power switch devices in accordance with selected embodiments of the present disclosure.

If speed is needed and current consumption is a concern in some modes of operation (e.g., power down, deep sleep), the comparator 70 can be dynamically biased with a fraction of the current coming out of the $V_{OUT}$ node (FIGS. 8 and 9). For light loads, when speed is not necessary, the comparator 70 can be biased with a few tens of nA. For heavy loads when speed is needed and current consumption is not a concern, the bias current can be increased up to a couple of μA.

As disclosed herein, the comparator 70 may include enablement circuitry (not shown for purposes of simplicity) which is connected to enable or disable the comparator 70 in response to an enable control signal (ENABLE). For example, the enablement circuitry can be designed to disable the comparator 70 in response to the enable control signal being reset (e.g., ENABLE=GND), thereby generating a first set of comparator output signals (e.g., OUT N=HIGH, OUT P=LOW) which are provided to the level shifters and cross-coupled switch to connect the output node to the first input voltage supply (e.g., $V_{MAX}=V_{SUP1}$). Alternatively, the enablement circuitry may be designed to connect the output node to the second input voltage supply (e.g., $V_{MAX}=V_{SUP2}$) when the comparator block 70 is disabled. This gives to the comparator block 70 an additional degree of flexibility, as it can be used even if one supply only is connected to the system on chip (SoC). Alternatively, the enablement circuitry could be designed in such a way that all switches are OFF by default. Although not explicitly showed, this patent covers that case too.

For an improved understanding of selected embodiments of the present disclosure, reference is now made to FIG. 8 which depicts a simplified circuit schematic of a PMOS power switch system 80. As depicted, the PMOS power switch system 80 includes an active n-well voltage supply switching circuit 81 that is connected over control switches 82 to a pair of PMOS power switch devices P1, P6. The depicted control switches 82 may be implemented with a cross-coupled set of small control PMOS devices P2-P5, each of which has an n-well connected to the output voltage $V_{MAX}$ generated by the n-well voltage supply switch 81 to ensure that each junction of the PMOS devices P2-P5 is reverse biased. As the PMOS devices P2-P5 do not carry DC current, the back-gate effect is negligible. In addition, the control switches 82 are connected to a level shifter block 83 and inverter 84 so that gate electrodes of the PMOS devices P1-P6 are driven by the inverted LS_NOT and the non-inverted output LS from level shifter 83 so as to supply an output node $V_{OUT}$ with one of two independent input voltage supplies $V_{SUP1}$, $V_{SUP2}$, depending on the level of the selection signal (SELECT $V_{SUP1}$) provided to the level shifter block 83.

In selected embodiments, the PMOS devices P1, P6 are power switches each built in their own, separate n-wells that are biased, respectively by the n-well bias voltages $V_{B1}$ 85 and $V_{B2}$ 86 provided by the control switches 82 which are small PMOS devices P2-P5. To drive the control switches 82, the n-well voltage supply switch 81 is connected to receive independent input voltage supplies $V_{SUP1}$, $V_{SUP2}$ and to generate the output voltage $V_{MAX}$ as the maximum of the input voltage supplies $V_{SUP1}$, $V_{SUP2}$ when enabled by the enable control signal (ENABLE). In selected embodiments, the n-well voltage supply switch 81 may be implemented with an active N-well switching circuit substantially as depicted in FIG. 6, though any suitable maximum voltage selection circuit may be used. The n-well voltage supply switch 81 may include a comparator having an output that used to automatically connect the output node Vou-r to the maximum of the independent input voltage supplies $V_{SUP1}$, $V_{SUP2}$. In order to implement such a functionality, it is sufficient to connect the input SELECT $V_{SUP1}$ of the level shifter 83 to the negative output OUT N of the comparator 61 in FIG. 6 (not shown in FIG. 8). In this configuration, the input power supply of the level shifter 83 (SUP_DIG if FIG. 8) is to be connected to the power supply of the comparator 61 in FIG. 6 (VDD node in the power supply generator 71 in FIG. 7). By operation of the control switches 82 and level shifter block 83, when one input voltage supply (e.g., $V_{SUP1}$) is connected to the output node $V_{OUT}$ (e.g., by P1), the other input voltage supply (e.g., $V_{SUP2}$) is isolated (e.g., by P6).

At the level shifter block 83, the digital power supply (SUP_DIG) is the power supply domain (usually digital) where the selection signal (SELECT $V_{SUP1}$) is generated, when automatic maximum voltage selection functionality is not implemented. In order to properly drive the output PMOS power switch devices P1, P6, the selection signal (SELECT $V_{SUP1}$) is shifted to the output voltage $V_{MAX}$ domain by the level shifter block 83 and inverted by the inverter 84 so the selection signal (SELECT $V_{SUP1}$) and its complement can be used to select the PMOS devices P1-P6. The $V_{MAX}$ node is not loaded with any DC current, and any some small junction capacitances can be easily driven by the output stage of the n-well voltage supply switch 81 (e.g., cross-coupled switch 63). If desired, a buffer could be provided at the output of the n-well voltage supply switch 81 so enable the output voltage $V_{MAX}$ to drive bigger a load.

In operation, the PMOS power switch system 80 responds to the selection signal having a first predetermined value (e.g., SELECT $V_{SUP1}$=1) so that the level shifter 83 and inverter 84 turn ON the PMOS devices P1-P3 and turn OFF the PMOS devices P4-P6. If the PMOS power switch device P1 is ON and the PMOS power switch device P6 is OFF, then the first voltage supply $V_{SUP1}$ is connected to the output node $V_{OUT}$, and the second voltage supply $V_{SUP2}$ is isolated. In addition, with the control switch PMOS device P2 turned ON and the control switch PMOS device P4 turned OFF, the n-well of the PMOS power switch device P1 is connected to the source of the same device so that there is no back-gate effect on the ON power switch P1. Likewise, since the control switch PMOS device P3 is turned ON and the control switch PMOS device P5 is turned OFF, the n-well of the PMOS power switch device P6 is connected to the output voltage $V_{MAX}$ which is generated by the n-well voltage supply switch 81 as the maximum of the input voltage supplies $V_{SUP1}$, $V_{SUP2}$ so that the junction diodes of the OFF power switch P6 are reversed biased.

Conversely, the PMOS power switch system 80 responds to the selection signal having a second predetermined value (e.g., SELECT $V_{SUP1}$=0) by having the level shifter 83 and inverter 84 turn OFF the PMOS devices P1-P3 and turn ON the PMOS devices P4-P6. As a result, the n-well of the deactivated PMOS power switch device P1 is connected to the output voltage $V_{MAX}$ from the n-well voltage supply switch 81 so that the junction diodes of the OFF power switch P1 are reversed biased, and the n-well of the activated PMOS power switch device P6 is connected to the source of the same device so that there is no back-gate effect on the ON power switch P6.

While the n-well voltage supply switch 81 in the PMOS power switch system 80 reduces the floating effects at the output node VAX, the power PMOS devices P1, P6 might float for a short time, depending on how the input voltage supplies $V_{SUP1}$, $V_{SUP2}$ ramp up until the comparator has sufficient power to make its decision. During this time, the parasitic vertical PNP junction associated with the power PMOS devices P1, P6 might turn ON for a short time, injecting current into the substrate. Depending on the circuits placed in the area surrounding the power PMOS devices P1, P6, a thyristor might also be triggered. In order to avoid such an unwanted start up behavior, the PMOS power switch system 80 may be modified to surround the power PMOS devices P1, P6 with plenty of substrate contacts. In addition, the layout of the PMOS power switch system 80 may be arranged to the locate the power PMOS devices P1, P6 as far as possible from other structures. Also, the power PMOS devices P1, P6 can be controlled to ensure they are turned OFF during power up, before the comparator makes its decision. Finally, the two n-wells of the power PMOS devices P1, P6 can be connected to the source of the respective devices. Once the comparator is up and running, the connections shown in FIG. 8 can be re-established.

As disclosed herein, the n-well voltage switching circuit and methodology may be used to bias n-wells of PMOS switching devices so as to remap two independent voltage supplies to an output n-well bias supply voltage in such a way that their difference is the maximum possible, thereby preventing latch-up related effects. However, the independent voltage supply selection benefit may also be applied in other power switching applications. For example, reference is now made to FIG. 9 which depicts an NMOS power switch system 90 wherein an active power supply switching circuit 94 is used to generate a gating control signal for a pair of native (zero-threshold) NMOS devices N1, N2. As depicted, the NMOS power switch system 90 includes a comparator 92 that is connected to an active power supply switching circuit 94 that provides an output voltage $V_{MAX}$ to first and second level shifters 93, 95 which drive the gates of NMOS native devices N1, N2. The comparator 92 replaces the comparator 61 in FIG. 6. As the native NMOS devices N1, N2 have their bulks connected to ground (GND), the conditions for latch-up do not exist, no matter how the input voltage supplies $V_{SUP1}$, $V_{SUP2}$ ramp up. In addition, this configuration eliminates the need for control switches 82 and level shifters 83, 84, such as shown in FIG. 8.

In the depicted NMOS power switch system 90, the comparator 92 receives a power supply voltage $V_{DD}$ from the power supply generator 91. While any suitable design may be used for the power supply generator 91, in selected embodiments, the power supply generator 91 may be implemented with a diode-based bulk switching circuit that includes a pair of diode-connected transistors P1, P2 connected to generate the power supply voltage $V_{MAX}$ from the input voltage supplies $V_{SUP1}$, $V_{SUP2}$ that is provided to the comparator 92. Due to the gate-drain connection of the transistors P1, P2, there is a $V_{GS}$ voltage drop between the maximum of the input voltage supplies $V_{SUP1}$, $V_{SUP2}$ and the power supply voltage $V_{DD}$. If the comparator bias current is sufficiently low and the transistors P1, P2 are properly sized, then $V_{DD}$=max ($V_{SUP1}$, $V_{SUP2}$)–$V_{GS}$≈max ($V_{SUP1}$, $V_{SUP2}$)–|$V_{TP}$|. The gate-bulk connection of the transistors P1, P2 decreases |$V_{TP}$|, which gives the comparator 92 more headroom. The source-to-gate voltage of the transistors P1, P2 should be kept low enough so that the source-to-bulk parasitic diodes of transistors P1, P2 are not turned ON. Moreover, the transistors P1, P2 should be laid out properly (e.g., including guard rings, increasing distance, etc.) in order to prevent triggering of silicon-controlled rectifier (SCR) structures. As will be appreciated, other voltage supply generator circuits can be used to provide the supply voltage $V_{DD}$ to the comparator 92.

However supplied, the comparator 92 is used to decide which native NMOS output device N1, N2 is turned ON to connect the higher of the independent input voltage supplies $V_{SUP1}$, $V_{SUP2}$ to the output $V_{OUT}$. To this end, the active power supply switching circuit 94 is connected to receive the differential outputs OUT_P, OUT_N from the comparator 92 and to supply to the level shifters 93, 95 the output voltage $V_{MAX}$ as the maximum of the input voltage supplies $V_{SUP1}$, $V_{SUP2}$. In selected embodiments, the active power supply switching circuit 94 is the N-well switching circuit 60 shown in FIG. 6, except that the comparator 61 has been replaced by the comparator 92. By outputting the output voltage $V_{MAX}$ as the maximum of the input voltage supplies $V_{SUP1}$, $V_{SUP2}$, the active power supply switching circuit 94 shifts up the outputs OUT_P, OUT_N from the comparator 92. At each level shifter block 93, 95, the supply voltage (Vi)) domain (where the comparator output signal is generated) is shifted to the output voltage $V_{MAX}$ domain in order to properly drive the output native NMOS power switch devices N1, N2. By shifting the comparator output signals OUT_P, OUT_N from the supply voltage ($V_{DD}$) domain to the output voltage $V_{MAX}$ domain, the gates of the native NMOS devices N1, N2 can be driven, though an additional negative gate voltage generator (not shown) may be added to turn OFF the deactivated native NMOS device, in case the drain of that native NMOS device is tied to zero.

In operation, if the first input voltage supply is larger than the second input voltage supply (e.g., $V_{SUP1} > V_{SUP2}$), then the positive output OUT_P of the comparator 92 is $V_{DD}$), and is shifted up by the $V_{DD}/V_{MAX}$ level shifter 93 to a level shifted signal LSI which is the output voltage $V_{MAX}$=max $(V_{SUP1}, V_{SUP2})$=$V_{SUP1}$. With the gate voltage set to $V_{SUP1}$, the native NMOS transistor N1 is turned ON, thereby setting the output node $V_{OUT}=V_{SUP1}-I_{DS,N1} \cdot R_{DS,N1} \approx V_{SUP1}$ if the native NMOS transistor N1 is properly sized. In addition, with the negative output OUT_N of the comparator 92 being set to ground, the gate voltage of the native NMOS transistor N2 is also grounded, so the native NMOS transistor N2 is turned OFF to thereby isolate the second, smaller input voltage supply $V_{SUP2}$.

Conversely, if the first input voltage supply is smaller than the second input voltage supply (e.g., $V_{SUP1} < V_{SUP2}$), then the output node $V_{OUT}=V_{SUP2}-I_{DS,N2} \cdot R_{DS,N2} \approx V_{SUP2}$ if the native NMOS transistor N2 is properly sized. In addition, the native NMOS transistor N1 is turned OFF to thereby isolate the first, smaller input voltage supply $V_{SUP1}$.

The advantage of the depicted NMOS power switch system 90 is its structural simplicity, as the bulk of both the native NMOS transistors N1, N2 is permanently connected to ground so that there is no bulk switching required, and latch-up is naturally prevented. However, there are disadvantages to the topology of the NMOS power switch system 90. For example, there are additional die costs for using native NMOS transistors N1, N2. Another disadvantage of the NMOS power switch system 90 arises if one supply is grounded, in which case the minimum Vs of the native device connected to that supply is zero which is not sufficient to turn it off, causing a shortcut between the two supplies. To prevent this, the gate of the device whose drain is connected to that supply needs to be biased below zero in order to ensure that the device is OFF. This requires the use of a negative charge pump and accessory circuits to generate a sufficiently negative voltage to be applied to the gate of the native device that needs to be turned OFF. While such charge pump and accessory circuitry (i.e., oscillator) can be supplied, it imposes costs in terms of extra area and current consumption.

To address these problems and others, there is disclosed herein a control switching circuit for connecting the higher of two independent power supplies to an output power supply rail by generating optimal n-well bias voltages for PMOS power switches, independently of how close the two independent power supplies are, in order to avoid forward biased junction diodes, even when one power supply is floating or grounded. The efficiencies obtained from the disclosed control switching circuit include avoiding the need for any costly process option (e.g., triple well, native transistor devices, bipolar transistors) by providing a solution that can be implemented in any bulk CMOS baseline n-well process. In selected embodiments, optimal n-well bias voltages may be generated from input voltage supplies $V_{SUP1}$, $V_{SUP2}$ using a control switching circuit which includes a comparator, an active power supply switching circuit, a level shifter, and a gate driver circuit which are connected and configured to re-map the input voltage supplies $V_{SUP1}$, $V_{SUP2}$ into bulk supply voltages for the PMOS power switches. As disclosed, the gate driver circuit ensures that the two PMOS power switches are turned OFF during the power up phase when the comparator is still not ready to operate, and also provides the correct timing during supply switching so that there is never cross-current flowing between the two power supplies. To control the proper timing of the gate driver circuit, a timing control signal is generated to indicate when the comparator is ready to operate, and then level shifted to the maximum power supply level $V_{MAX}$ and inverted to drive switches in the gate driver circuit so that the risk of latch-up during the power up phase is avoided and so that charging of a high impedance floating output is avoided.

Figure 10:
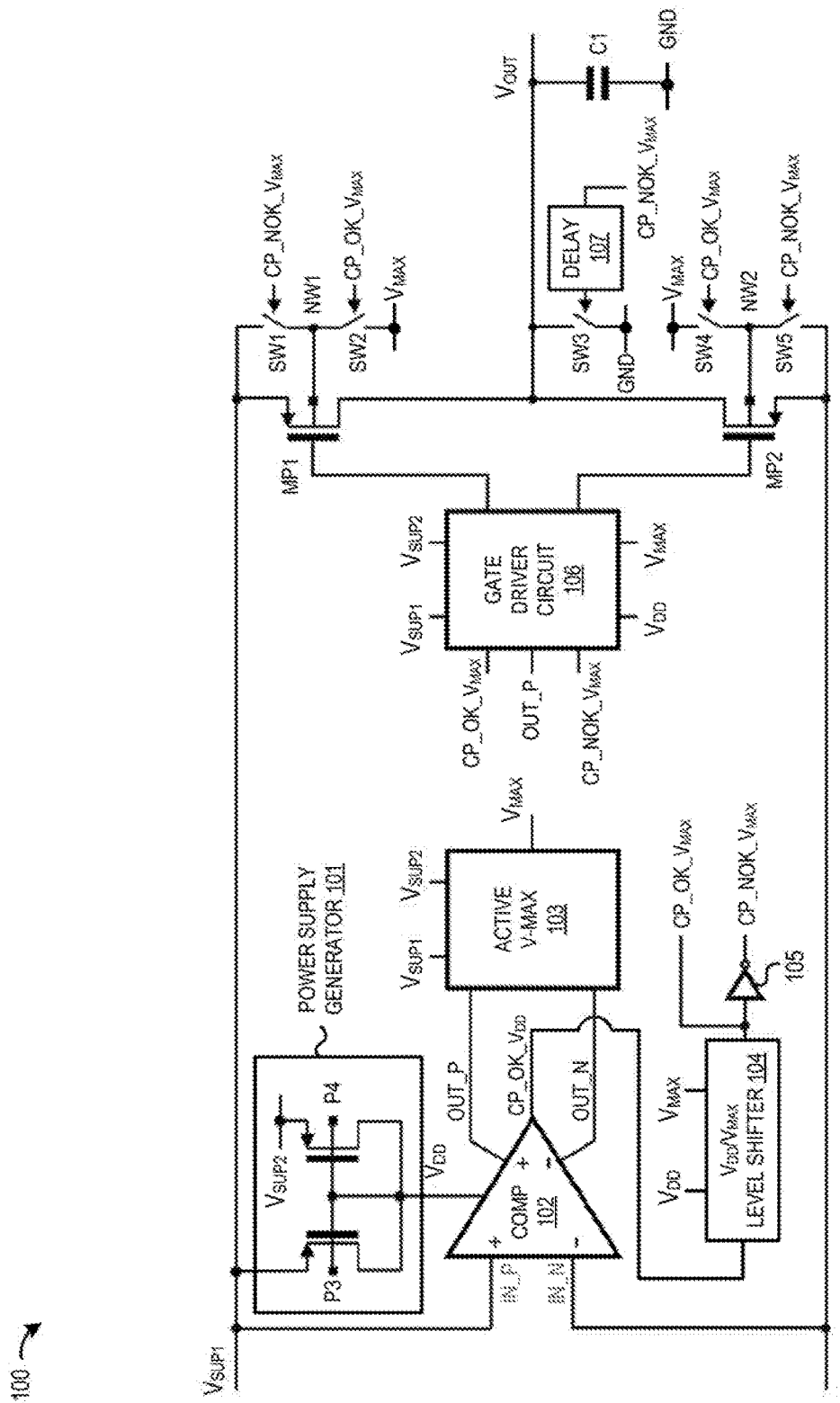
FIG. 10 depicts a simplified block diagram of an PMOS power switch system which includes an active power supply switching circuit and gate driver circuit for generating a gating control signal for a pair of PMOS power switch devices in accordance with selected embodiments of the present disclosure.

For an improved understanding of selected embodiments of the present disclosure, reference is now made to FIG. 10 which depicts a simplified circuit schematic of an active N-well switching circuit 100 for a PMOS power switch system which uses a comparator 102, active power supply switching circuit 103, gate driver circuit 106, and switching array SW1-SW5 to generate control signals for a pair of PMOS power switch devices MP1, MP2 by remapping first and second independent voltage supplies $V_{SUP1}$, $V_{SUP2}$ to bias the n-well of the PMOS power switches MP1, MP2 while simultaneously driving the gate terminals of the PMOS power switches MP, MP2. As depicted, the topology of the active N-well switching circuit 100 uses PMOS power devices MP1, MP2 instead of native NMOS devices, and is suitable for cases where one of the voltage supplies $V_{SUP1}$, $V_{SUP2}$ is grounded.

Generally speaking, the comparator 102 is connected to receive the first and second independent voltage supplies $V_{SUP1}$, $V_{SUP2}$ as input signals IN_P and IN_N at the non-inverting and inverting inputs, and in response, generates output signals OUT_N, OUT_P which are connected to the active power supply switching circuit 103, with the output signal OUT_P also being connected to the gate driver circuit 106. The active power supply switching circuit 103 may use the same circuit as shown in FIG. 6 (except with the comparator 61 being replaced by the comparator 102), and is connected to receive the differential outputs OUT_P, OUT_N from the comparator 102 and to supply the output voltage $V_{MAX}$ as the maximum of the input voltage supplies $V_{SUP1}$, $V_{SUP2}$. As depicted, the output voltage $V_{MAX}$ is supplied as an input to the level shifter 104 and to the gate driver circuit 106.

The comparator 102 also generates an output signal CP_OK_$V_{DD}$ to indicate when the comparator 102 is ready to operate. One way to generate this signal is to monitor the comparator bias current and generate the output signal CP_OK_$V_{DD}$ when the bias current is close to its final value. At the level shifter 104, the output signal CP_OK_$V_{DD}$ is shifted up to $V_{MAX}$=max $(V_{SUP1}, V_{SUP2})$ to generate a first level shifted control signal CP_OK_$V_{MAX}$ and to generate a second level shifted control signal CP_NOK_$V_{MAX}$ at the output of the inverter 105. The resulting first level shifted control signal CP_OK_$V_{MAX}$ is just the output signal CP_OK_$V_{MAX}$ shifted to the $V_{MAX}$ level and the second level shifted control signal CP_NOK_$V_{MAX}$ is an inverted version of the first level shifted control signal CP_OK_$V_{MAX}$. The two level shifted control signals CP_OK_$V_{MAX}$, CP_NOK_$V_{MAX}$ are connected to the gate driver circuit 106 and to control the bulk switching devices SW1-SW2, SW4-SW5 which selectively bias the bulk substrate of the PMOS power switches MP1, MP2 in order to prevent latch-up during the power up phase. In particular, the first level shifted control signal CP_OK_$V_{MAX}$ is applied to bulk switching devices SW2, SW4 to connect $V_{MAX}$, respectively, to the n-wells NW1, NW2 of the PMOS power switches MP1, MP2. Likewise, the second level shifted control signal CP_NOK_$V_{MAX}$ is applied to bulk switching devices SW1, SW5 to connect $V_{SUP1}$, $V_{SUP2}$, respectively, to the n-wells NW1, NW2 of the PMOS power switches MP1, MP2. In addition, the second level shifted control signal CP_NOK_$V_{MAX}$ is applied to a delay circuit 107 for using in driving a weak pull down device SW3 to ensure that the switching circuit output $V_{OUT}$ is grounded during power up—when both power devices are OFF—to avoid charging a high impedance floating output that would result in forward biased drain-to-bulk junction diodes.

Figure 11:
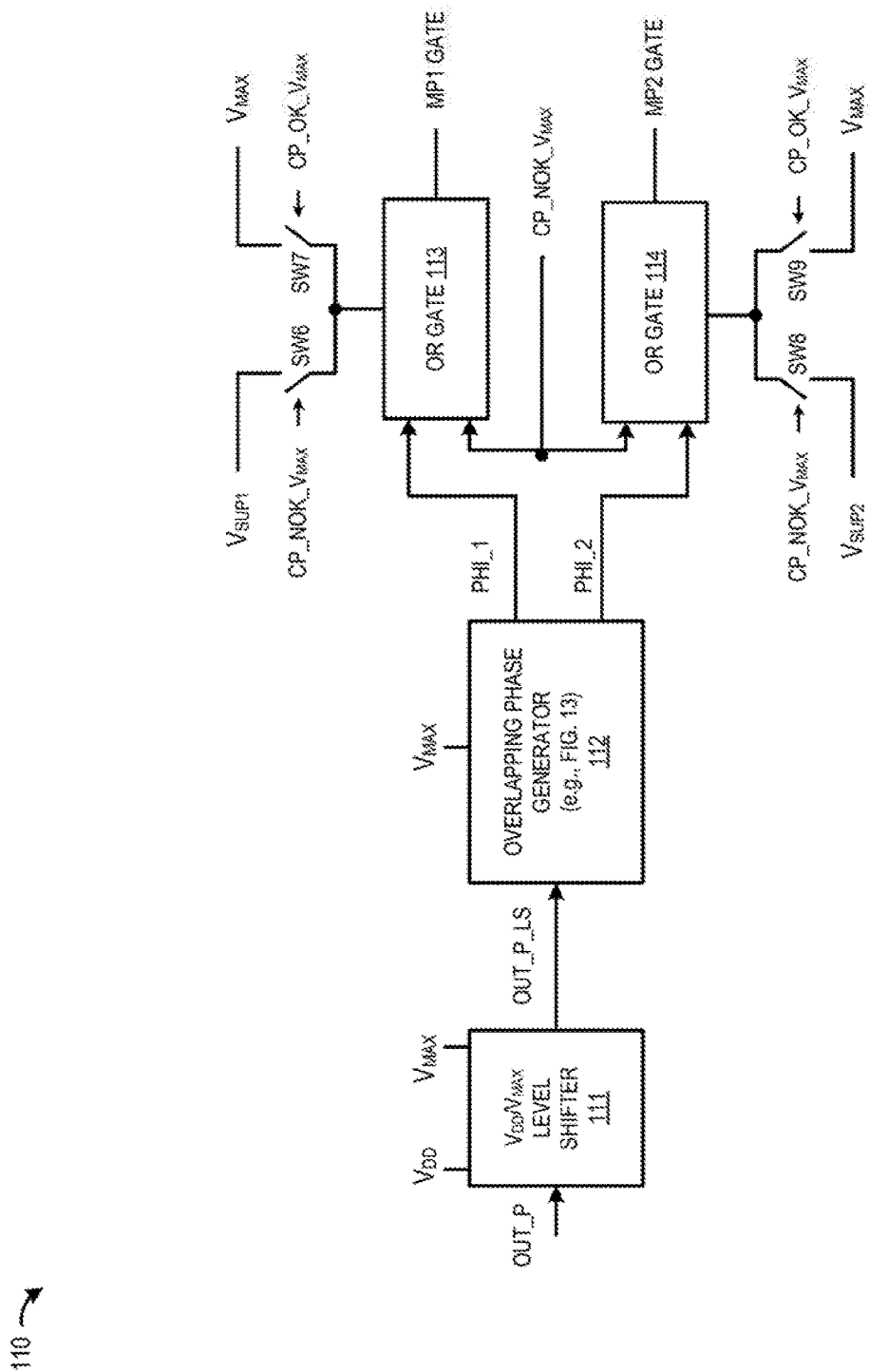
FIG. 11 depicts a simplified circuit schematic diagram of a gate driver circuit in accordance with selected embodiments of the present disclosure.

As disclosed herein, the gate driver circuit 106 is provided to drive the gate terminals of the PMOS power switches MP1, MP2 to ensure that they are turned OFF during the power up phase when the comparator 102 is not ready to operate. In addition, the gate driver circuit 106 provides the correct timing during supply switching, so that there is no cross-current flowing between the two power supplies $V_{SUP1}$, $V_{SUP2}$. While any suitable gate driving signal generator may be used, reference is now made to FIG. 11 which depicts a simplified circuit schematic diagram of a gate driver circuit 110 in accordance with selected embodiments of the present disclosure. As depicted, the gate driver circuit 110 includes a level shifter 111 that is connected to shift the received positive comparator output OUT_P from the supply voltage ($V_{DD}$) domain (where the comparator output signal is generated) to the output voltage $V_{MAX}$ domain by generating a level shifted positive comparator output OUT_P_LS. The gate driver circuit 110 also includes an overlapping phase generator 112 which is driven by the level shifted positive comparator output OUT_P_LS to generate overlapping phase signals PHI_1, PHI_2. In addition, the gate driver circuit 110 includes first and second OR gates 113, 114 which are connected, respectively, to receive the overlapping phase signals PHI_1, PHI_2 as first inputs, and which also receive a second shared input signal CP_NOK_$V_{MAX}$. The outputs of both OR gates 113, 114 are forced to HIGH when the shared input signal CP_NOK_$V_{MAX}$=logic 1. In addition, each OR gate 113, 114 is connected, respectively, by switches SW6/SW7, SW8/SW9 to selectively receive switched supplies under control of the level shifted control signals CP_OK_$V_{MAX}$, CP_NOK_$V_{MAX}$. In particular, the first OR gate 113 is respectively connected over switches SW6, SW7 to the first power supply $V_{SUP1}$ and the output voltage $V_{MAX}$ under control of the level shifted control signals CP_NOK_$V_{MAX}$, CP_OK_$V_{MAX}$, respectively. In addition, the second OR gate 114 is respectively connected over switches SW8, SW9 to the second power supply $V_{SUP2}$ and the output voltage $V_{MAX}$ under control of the level shifted control signals CP_NOK_$V_{MAX}$, CP_OK_$V_{MAX}$, respectively.

Figure 12:
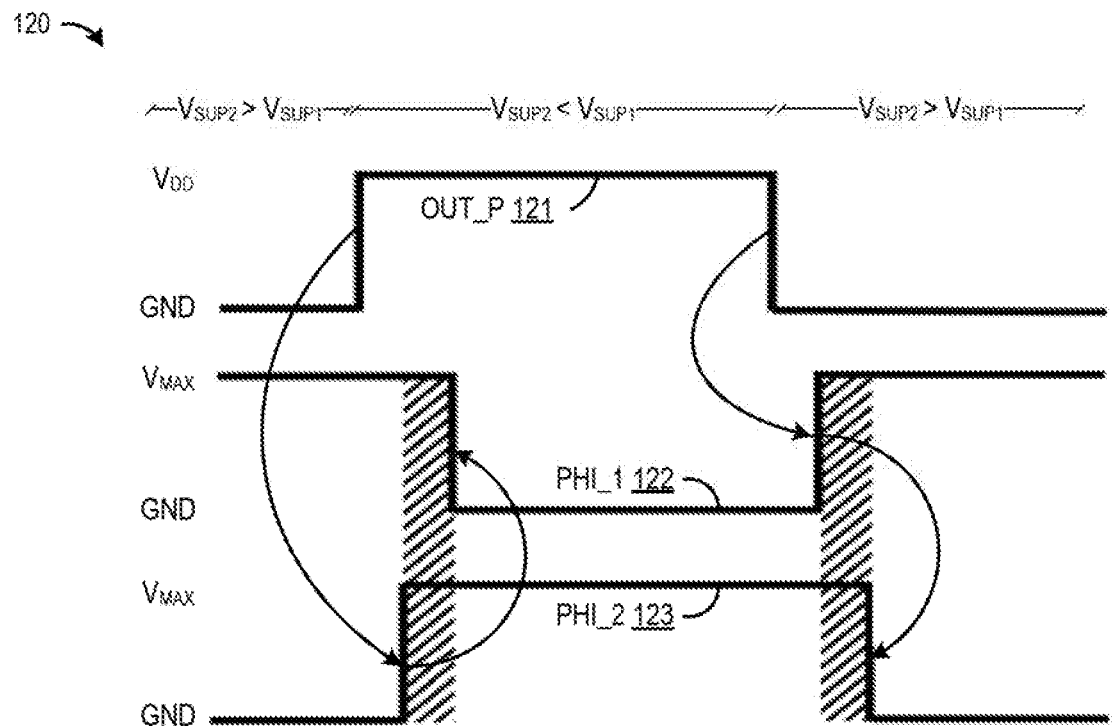
FIG. 12 depicts gate driver timing diagram waveforms for internal phase signals of the gate driver circuit in accordance with selected embodiments of the present disclosure.

To illustrate the behavior of the overlapping phase generator 112, reference is now made to FIG. 12 which depicts gate driver timing diagram waveforms 120 for generating the internal phase signals PHI_1, PHI_2 122, 123 from the comparator output OUT_P 121 in accordance with selected embodiments of the present disclosure. As illustrated, the positive output OUT_P 121 of the comparator is initially at ground, indicating that the power supply situation is $V_{SUP2}>V_{SUP1}$. In this scenario, the outputs of the overlapping phase generator 112 are PHI_1=$V_{MAX}$ and PHI_2=GND, respectively. With the OR gate input CP_NOK_$V_{MAX}$ being set low, both of the OR gates 13, 114 behave like buffers for the internal phase signals PHI_1, PHI_2 122, 123. As a result, the internal phase signal PHI_1 122 drives the gate of MP1=$V_{MAX}$ and the internal phase signal PHI_2 123 drives the gate of MP2=ground. With these gate driving signals, the output PMOS power transistor MP2 is turned ON, while the output PMOS power transistor MP1 is turned OFF so that the second (higher) power supply $V_{SUP2}$ is connected to the output voltage $V_{OUT}$.

FIG. 12 also illustrates the case when $V_{SUP2}<V_{SUP1}$ which occurs when the comparator output OUT_P 121 toggles to trigger a low-to-high transition in the internal phase signal PHI_2 123, thereby turning OFF the PMOS power transistor MP2. After a small delay (e.g., in the order of a few nanoseconds), the internal phase signal PHI_1 122 toggles from high-to-low, thereby turning ON the PMOS power transistor MP1. As a result, the output PMOS power transistor MP is turned ON so that the first (higher) power supply $V_{SUP1}$ is connected to the output voltage $V_{OUT}$.

If the second power supply $V_{SUP2}$ exceeds the first power supply $V_{SUP1}$, the comparator output OUT_P 121 then goes low and triggers the low-to-high transition of the internal phase signal PHI_1, 122 and (after a small delay) the high-to-low transition of the internal phase signal PHI_2, 123. As seen from the foregoing, the break-before-make mechanism implemented in the overlapping phase generator 112 ensures that internal phase signal PHI_2, 123 goes LOW after the internal phase signal PHI_1, 122 is HIGH, so that the PMOS power transistor MP1 is turned OFF before the PMOS power transistor MP2 is turned ON. Cross current between the two supplies is then avoided for any transition of the comparator output. During the short time (a few ns) in which both the PMOS power transistor MP1, MP2 are OFF (two shaded areas in FIG. 12), the load current is supplied by the load capacitor C1 (FIG. 10) that is connected to the output node $V_{OUT}$. As a result the load capacitor C1 should be sized to ensure that the voltage drop is within specification at maximum load current.

Referring back to FIG. 10, as long as the level shifted control signal CP_OK_$V_{MAX}$=logic 0 and the level shifted control signal CP_NOK_$V_{MAX}$=logic 1, this means that the comparator 102 is not ready to operate. In this case, the switches SW1 and SW5 are ON, while the switches SW2 and SW4 are OFF. In this case, the n-well NW1 of the PMOS power transistor MP1 is then connected to the first power supply $V_{SUP1}$ and the n-well NW2 of the PMOS power transistor MP2 is connected to the second power supply $V_{SUP2}$. With the switch SW3 connected as a weak pull-down device to receive the delayed level shifted control signal CP_NOK_$V_{MAX}$, the output node Vo-r is held to ground while the level shifted control signal CP_OK_$V_{MAX}$=logic 0, thereby ensuring that the n-well-to-drain junctions of the PMOS power transistors MP1, MP2 are never forward biased, regardless of the levels of the power supplies $V_{SUP1}$, $V_{SUP2}$, including the case that one of them is grounded.

When the level shifted control signal CP_OK_$V_{MAX}$=logic 0 and the level shifted control signal CP_NOK_$V_{MAX}$=logic 1 (indicating the comparator is not ready), the switches SW6, SW8 are turned ON and the switches SW7, SW9 are turned OFF so that the OR gate 113 is supplied by the first power supply $V_{SUP1}$ and the OR gate 114 is supplied by the second power supply $V_{SUP2}$, consistently with the voltages at the source of the PMOS power devices MP1, MP2 (as shown in FIG. 10). With the gates of the PMOS power devices MP1, MP2 being driven by the gate driver circuit 106 at the $V_{SUP1}$, $V_{SUP2}$ power supply levels, respectively, and with the common drain of the PMOS power devices MP1, MP2 kept grounded by the switch SW3, the PMOS power devices MP1, MP2 are ensured to be turned OFF. As a result of this configuration, the overlapping phase signals PHI_1, PHI_2 generated by the overlapping phase generator 112 are selectively connected over the OR gates 113, 114 to ensure a break-before-make behavior of the two PMOS power transistors MP1, MP2 to prevent cross current between the two power supplies $V_{SUP1}$, $V_{SUP2}$ during supply switching. In addition, the resulting supply voltage connections means that all sourceto-n-well junction diodes are not biased and all drain-to-n-well junction diodes are reversed biased, so there is no current injected into the substrate.

Once the comparator 102 is ready to operate, the level shifted control signal CP_OK_$V_{MAX}$=logic 1, the level shifted control signal CP_NOK_$V_{MAX}$=logic 0, and the output voltage $V_{MAX}$=max($V_{SUP1}$, $V_{SUP2}$). As a result, the switches SW6 and SW8 are turned OFF, and the switches SW7 and SW9 are turned ON so that both OR gates 113, 114 are supplied by output voltage V at the same time that the n-wells of the power PMOS transistors MP1, MP2 are both connected to $V_{MAX}$, being switches SW and SWS turned OFF and switches SW2 and SW4 turned ON. Once the delayed switch SW3 turns OFF, the output voltage $V_{OUT}$ is the greater between $V_{SUP1}$ and $V_{SUP2}$. The duration of the delay circuit 106, which can be as short as a few nanoseconds, ensures that the n-well of PMOS transistors MP1, MP2 are sufficiently charged to $V_{MAX}$ before $V_{OUT}$ rises. This avoids forward biasing the n-well-to-drain junctions of the power PMOS transistors MP, MP2 at the end of the power up phase. In addition, all source-to-n-well and drain-to-n-well junction diodes are not biased or reversed biased, so no current is injected into the substrate.

Depending upon which power supply $V_{SUP1}$, $V_{SUP2}$ is higher, there is some current flowing from that supply to ground through the switch SW3, but only during the few nanoseconds between the power PMOS transistors MP1, MP2 turning ON and the switch SW3 turning OFF. This current is negligible with respect to both the load current and the current needed to charge the load capacitor C1 when the switch SW3 is embodied as a weak pull-down device. The short duration of such a current, and the fact that it happens only one time at the end of the power up phase, does not significantly impact the overall efficiency of the circuit.

Figure 13:
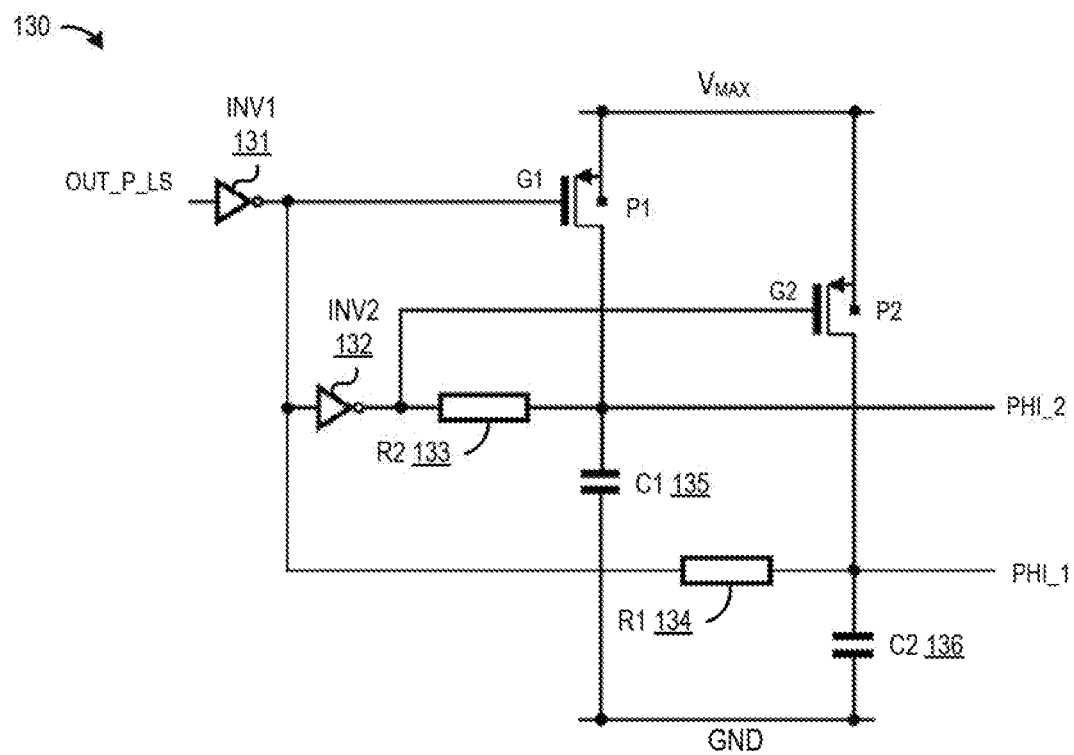
FIG. 13 depicts a simplified circuit schematic diagram of an overlapping phase generator in accordance with selected embodiments of the present disclosure.

As disclosed herein, the overlapping phase generator 112 is provided to ensure a break-before-make behavior of the two PMOS power switches MP1, MP2, to prevent cross current between the power supplies $V_{SUP1}$, $V_{SUP2}$ during supply switching. While any suitable overlapping signal generator may be used, including but not limited to analog, digital, mixed signal circuits capable of generating the waveforms 120 shown in FIG. 12, reference is now made to FIG. 13 which depicts a simplified circuit schematic diagram of an overlapping phase generator 130 in accordance with selected embodiments of the present disclosure. As depicted, the overlapping phase generator 130 is connected to receive the level-shifted comparator output signal OUT_P_LS, which may be generated by a $V_{DD}$ to $V_{MAX}$ level shifter (e.g., 111) of the gate driver circuit (e.g., 110). The depicted overlapping phase generator 130 includes a first and second inverters 131, 132 which are powered by the active output voltage $V_{MAX}$ and which are connected in series to receive the level-shifted comparator output signal OUT_P_LS and to distribute inverted and non-inverted versions of the level-shifted comparator output signal OUT_P_LS to the remainder of the overlapping phase generator 130. In particular, the first inverter 131 provides an inverted version of the level-shifted comparator output signal OUT_P_LS to a gate terminal G1 of a first PMOS transistor P1 which is connected with a first capacitor C1 135 to form a first circuit branch between the active voltage $V_{MAX}$ and ground. In addition, the second inverter 132 provides a non-inverted version of the level-shifted comparator output signal OUT_P_LS to a gate terminal G2 of a second PMOS transistor P2 which is connected with a second capacitor C2 136 to form a second circuit branch between the active voltage $V_{MAX}$ and ground. In order to generate the overlapping phase signals PHI_1, PHI_2, the first inverter 131 is connected to provide the inverted version of the level-shifted comparator output signal OUT_P_LS to a first resistor R1 134 which is connected to the second circuit branch at the shared node between the second PMOS transistor P2 and second capacitor C2 136, thereby generating the first phase signal PHI_1. In similar fashion, the second inverter 132 is connected to provide the non-inverted version of the level-shifted comparator output signal OUT_P_LS to a second resistor R2 133 which is connected to the first circuit branch at the shared node between the first PMOS transistor P1 and first capacitor C1 135, thereby generating the second phase signal PHI_2.

In operation, the overlapping phase generator 130 may receive the level-shifted comparator output signal OUT_P_LS=ground. In this case, the gate terminal G1 of a first PMOS transistor P1 is driven to the active voltage $V_{MAX}$, thereby turning the first PMOS transistor P1 OFF, while the gate terminal G2 of the second PMOS device P2 is driven to ground, thereby turning the second PMOS transistor P2 ON. With the second PMOS device P2 turned ON, the phase signal PHI_1 is tied to the active voltage $V_{MAX}$, while the phase signal PHI_2 is grounded by the NMOS pull-down device in the second inverter 132. With the first PMOS device P turned OFF, there is no contention between the first PMOS device P1 and the second inverter 132, allowing the phase signal PHI_2 to easily discharge to ground.

When the level-shifted comparator output signal OUT_P_LS toggles from ground to the active voltage $V_{MAX}$, the gate terminal G1 toggles from $V_{MAX}$ to ground, thereby turning the first PMOS transistor P1 ON to charge the first capacitor C1 135 which brings the phase signal PHI_2 to the active voltage $V_{MAX}$. Simultaneously, the gate terminal G2 toggles from ground to $V_{MAX}$, thereby turning the second PMOS transistor P2 OFF so that the phase signal PHI_1 is slowly discharged by the NMOS pull-down device in the first inverter 131 via the first resistor R. With the second PMOS transistor P2 being turned OFF, there is no contention between the second PMOS transistor P2 and the first inverter 131, allowing the phase signal PHI_1 to be discharged and kept grounded.

In the depicted overlapping phase generator 130, the first capacitor C1 135 is charged via the $R_{DS\_ON}$ resistance of the first PMOS transistor P1, while second capacitor C2 is discharged via the $R_{DS,ON}$ resistance of the NMOS pull-down device in the first inverter 131 in series with the first resistor R1 134. By properly sizing the first resistor R1 134, the low-to-high transition in the phase signal PHI_2 happens before the high-to-low transition of the phase signal PHI_, as shown in the first transition of FIG. 12.

When the level-shifted comparator output signal OUT_P_LS toggles from the active voltage $V_{MAX}$ to ground, the gate terminal G2 toggles from to $V_{MAX}$ to ground, thereby turning the second PMOS transistor P2 ON to charge the second capacitor C2 which brings the phase signal PHI_1 to the active voltage $V_{MAX}$. In addition, the gate terminal G1 toggles from ground to $V_{MAX}$, thereby turning the first PMOS transistor P1 OFF so that the phase signal PHI_2 is slowly discharged by the NMOS pull-down device in the second inverter 132 via the second resistor R2 133. In this bias configuration, the second capacitor C2 136 is charged via the $R_{DS,ON}$ resistance of the second PMOS transistor P2, while the first capacitor C1 135 is discharged via the $R_{DS\_ON}$ resistance of the NMOS pull-down device in the second inverter 132 in series with the second resistor R2 133. By properly sizing the second resistor R2 133, the low-to-high transition of the phase signal PHI_1 happens before the high-to-low transition of the phase signal PHI_2, as shown in the second transition of FIG. 12.

Figure 14:
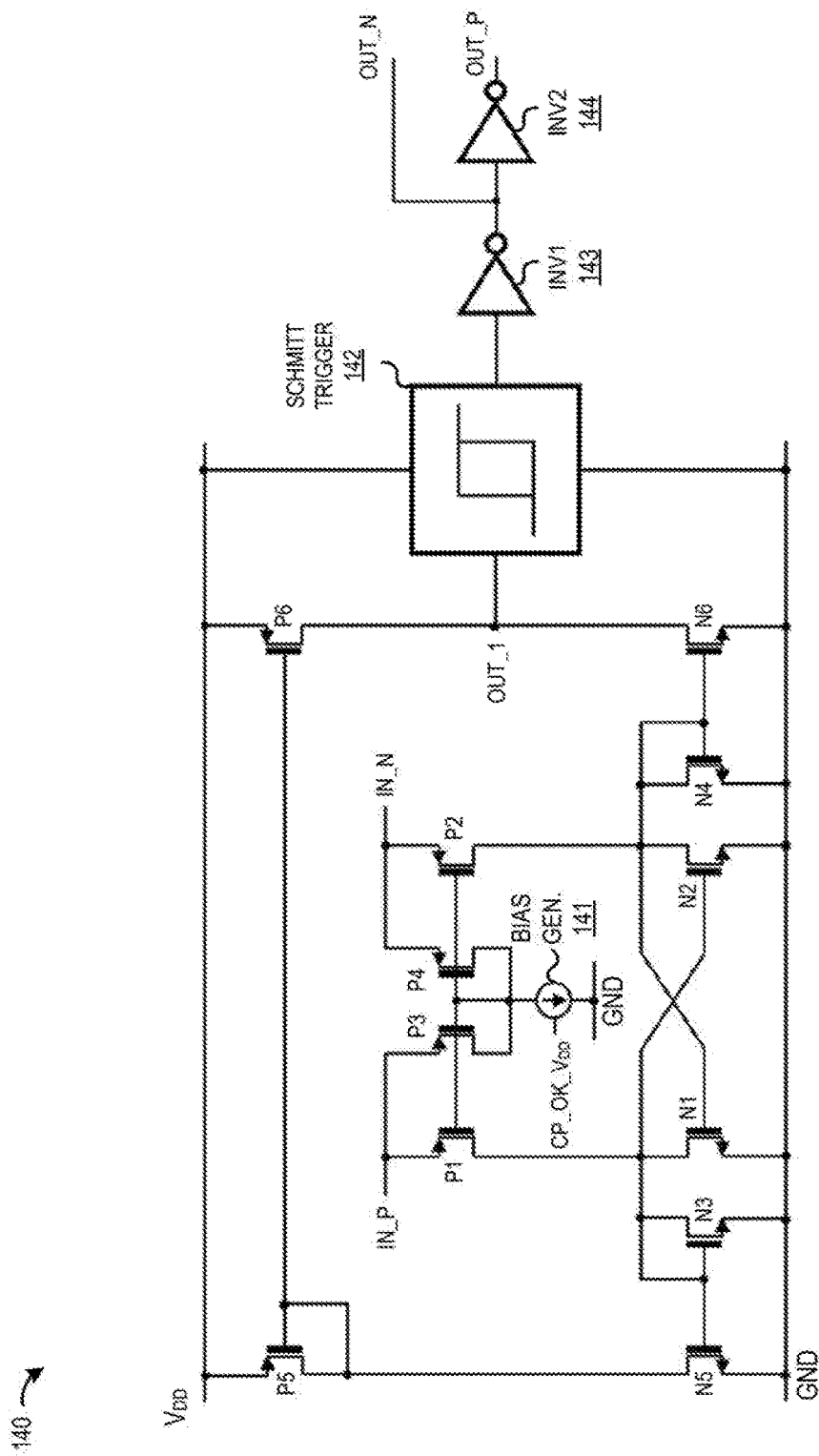
FIG. 14 depicts a simplified circuit schematic diagram of a comparator in accordance with selected embodiments of the present disclosure.

As disclosed herein, the comparator 112 is provided to detect which one of the differential power supply inputs $V_{SUP1}$, $V_{SUP2}$ is higher, and to generate corresponding differential outputs OUT_P, OUT_N along with a "comparator ready" output signal CP_OK_$V_{DD}$. While any suitable comparison circuit may be used, reference is now made to FIG. 14 which depicts a simplified circuit schematic diagram of a comparator 140 in accordance with selected embodiments of the present disclosure. As depicted, the comparator 140 is connected to receive the power supply inputs $V_{SUP1}$, $V_{SUP2}$ at the differential inputs IN_P, IN_N, and is also connected to the supply voltage $V_{DD}$ and ground (GND). The depicted comparator 140 includes an input stage P1-P4, a decision circuit stage N1-N4, and current mirror stages N5/P5, N6/P6. In the input stage, the differential inputs IN_P, IN_N are connected, respectively, to the shared source nodes of the first PMOS transistor pair P1, P3 and the second PMOS transistor pair P4, P2. With the diode-connected drains of the PMOS transistors P3, P4 connected in common to ground over a bias generator 141, the input stage P1-P4 is connected and configured in a differential-current-input, differential-current-output amplifier circuit having a relative low input impedance of $R_{IN}=2/gm$, and a differential current gain of $A_1=(W_1/L_1)/(W_1/L_1+W_3/L_3)$. In addition to providing current, the bias generator 141 produces the output signal CP_OK_$V_{DD}$ to indicate to the rest of the circuit that the comparator 140 is ready to operate.

The depicted comparator 140 also includes a decision circuit N1-N4 connected to the input stage P1-P4. The depicted decision circuit includes a pair of cross-coupled NMOS transistors N1, N2 having their respective drains connected to the drains of the PMOS transistors P1, P2, along with a pair of diode-connected NMOS transistors N3, N4 sharing the same drain and source with the cross-coupled NMOS transistors N1, N2. In this way, the decision circuit N1-N4 uses a positive feedback generated by the cross-gate connections of the NMOS transistors N1, N2. Hysteresis can be easily implemented by making $(W/L)_1 > (W/L)_3$ and $(W/L)_2 > (W/L)_4$. If the comparator inputs IN_P>IN_N, the current flows into the PMOS transistors P1, P3, and NMOS transistor N3. The current flowing into the NMOS transistor N3 pulls the gate of cross-coupled NMOS transistor N2 up, which in turn pulls the gate of cross-coupled NMOS transistor N1 down (N1 is OFF) and turns OFF the NMOS transistors N4 and N6. There is no current in N2 because its drain is pulled to ground.

With the current mirror N5/P5, the current into the NMOS transistor N3 is then mirrored by the NMOS transistor N5 and flows into the PMOS transistor P5. With the NMOS transistor N6 being turned OFF, there is no current flowing into the PMOS transistor P6, so the first output node OUT_1 is pulled to $V_{DD}$. By applying the first output node OUT_1 to the non-inverting Schmitt trigger ST 142, the waveform of the first output node OUT_1 is squared before being supplied to the output inverters INV1 143 and INV2 144 to generate, respectively, the comparator outputs OUT_N (negative) and OUT_P (positive) and to provide current to drive the capacitive load connected to the output nodes. Due to symmetry, the behavior is mirrored if comparator inputs IN_P<IN_N.

Thanks to current-mode approach employed by the comparator 140, no input level shifters are needed to accommodate the input range for the differential inputs IN_P, IN_N which can be as high as the voltage supplies $V_{SUP1}$, $V_{SUP2}$. As a result, no additional poles are introduced, and no extra current is needed to bias such level shifters. In addition, the switching speed is increased thanks to the fact that the first output node OUT_1 is the only high impedance node in the whole comparator 140. Moreover, there are cost savings from the fact that there are no ESD protections needed at the inputs since the voltage supplies $V_{SUP1}$, $V_{SUP2}$, are not connected to the gate of PMOS devices P1-P4, N1-N6. However, there is a small amount of current sunk from the differential inputs IN_P, IN_N.

The embodiments described above are capable of selecting voltage supply from two independent input voltage supplies, either of which may be higher than the other, by using a comparator and two level shifters to respectively bias the n-wells of two cross-coupled PMOS switching devices. By using the input voltage supply selection circuits disclose herein, the output voltage supply will never float, even if the two supplies are very close. Moreover, the effect of charge redistribution is greatly attenuated. The input voltage supply selection circuits may be implemented with PMOS power switches so that there is no requirement of using native NMOS devices which require additional fabrication processing steps. In other embodiments, the input voltage supply selection circuits may be implemented with native NMOS power switches to obtain similar results. There are other benefits of the disclosed input voltage supply selection circuits, including that there is no requirement of negative supply voltages, special clock signals, or additional fabrication processing steps, such as BiCMOS processing requirements. In addition, the back-gate effects are minimized with the disclosed input voltage supply selection circuits.

By now, it should be appreciated that there has been provided a power supply switching circuit and methodology for generating a maximum bias voltage at an output voltage node. As disclosed, the power supply switching circuit includes a comparator connected to receive and compare first and second power supplies, where the comparator is configured to generate a comparator activation signal when the comparator is ready to operate, and is configured to generate a first selection signal identifying which of the first and second power supplies is higher. In selected embodiments, the comparator includes a pre-amplification input stage comprising a differential-current-input, differential-current-output amplifier for generating first and second amplified signals; a decision circuit stage comprising first and second cross-coupled NMOS transistors connected to determine which of the first and second amplified signals is larger and to generate a decision output signal; and a gain stage connected to amplify the decision output signal and to generate the first selection signal identifying which of the first and second power supplies is higher. In selected embodiments, the pre-amplification input stage includes a bias amplification circuit for generating the comparator activation signal. The disclosed power supply switching circuit also includes an active voltage switching circuit connected to receive the first and second power supplies and configured to generate therefrom a maximum bias voltage which is the higher of the first and second power supplies. In selected embodiments, the active voltage switching circuit includes first and second cross-coupled PMOS transistors connected to receive first and second gate driving signals, where each cross-coupled PMOS transistor includes a gate connected to a drain of the other cross-coupled PMOS transistor, a drain tied to a gate of the other cross-coupled PMOS transistor, and a source connected to an output voltage node that is also coupled to an n-well for the cross-coupled PMOS transistor. The active voltage switching circuit also includes at least a first level shifter connected to receive the first selection signal and to generate a first level-shifted gate driving signal that is connected to the first or second power supply that is higher and where the second gate driving signal is connected to ground, wherein the first and second gate driving signals are connected, respectively, to the gates of the first and second cross-coupled PMOS transistors to pull a gate for one of the cross-coupled PMOS transistors to ground so that the higher of the first and second power supplies is coupled to the output voltage node over one of the first and second cross-coupled PMOS transistors, thereby generating the maximum bias voltage at the output voltage node. In addition, the disclosed power supply switching circuit includes a gate driver circuit connected to receive the first and second power supplies and configured to generate first and second power supply selection signals only in response to the comparator activation signal being activated by using the first selection signal to generate first and second overlapping phase signals which control timing of the first and second power supply selection signals so that a ground voltage is supplied as the first power supply selection signal only after the maximum bias voltage is supplied as the second power supply selection signal. In selected embodiments, the gate driver circuit includes an overlapping phase generator for generating the first and second overlapping phase signals in response to the first selection signal; and first and second OR gate driver circuits connected, respectively, to receive the first and second overlapping phase signals, where each of the first and second OR gate driver circuits is also connected to respond to the comparator activation signal so that the first and second overlapping phase signals activate one of the first and second power selection supply signals only after deactivating the other of the first and second power selection supply signals. The disclosed power supply switching circuit also includes first and second PMOS power transistors for connecting the first and second power supplies, respectively, to a power supply output in response to the first or second power supply selection signals provided, respectively, to gate terminals of the first and second PMOS power transistors. In selected embodiments, each of the first and second PMOS power transistors include a source connected to a respective first or second power supply, a drain connected to the power supply output, and an n-well connected over the bias switching circuit to the maximum bias voltage only in response to the comparator activation signal. To bias an n-well of each of the first and second PMOS power transistors, the disclosed power supply switching circuit includes a bias switching circuit connected to bias the n-wells to avoid forward biased junction diodes by connecting the n-well of each of the first and second PMOS power transistors to either the maximum bias voltage or one of the first and second power supplies in response to the comparator activation signal. In selected embodiments, the bias switching circuit includes first and second switches for connecting, respectively, the n-well of each of the first and second PMOS power transistors to the first and second power supplies when the comparator activation signal is not activated. In addition, the bias switching circuit may include a third switch for grounding the power supply output when the first and second PMOS power transistors are both OFF during power up to avoid charging the power supply output and prevent forward biased drain-to-bulk junction diodes.

In another form, there is provided a voltage switching circuit which includes a comparator, an active maximum voltage switching circuit, a first level shifter, a gate drive circuit, first and second PMOS power transistors, and a bias switching circuit. As disclosed, the comparator is connected to receive first and second power supplies, and is configured to generate a comparator activation signal when the comparator is ready to operate and to generate a first selection signal identifying which of the first and second power supplies is higher. In selected embodiments, the comparator includes a pre-amplification circuit connected to receive the first and second power supplies, where the pre-amplification circuit is configured as a differential-current-input, differential-current-output amplifier for generating first and second amplified signals. In selected embodiments, the pre-amplification input circuit may include a bias amplification circuit for generating the comparator activation signal when the bias amplification circuit generates a comparator bias current that is close to a final value. The comparator may also include a decision circuit connected to receive the first and second current signals, where the decision circuit is configured with cross-coupled NMOS transistors to determine which of the first and second current signals larger, and to generate one or more decision output voltage signals identifying which of the first and second power supplies is higher. In addition, the comparator may include a gain circuit connected to receive the one or more decision output voltage signals, where the gain circuit is configured to generate the first selection signal identifying which of the first and second power supplies is higher. In addition, the active maximum voltage switching circuit is connected to receive the first and second power supplies, and is configured to generate a maximum bias voltage which is the higher of the first and second power supplies. In selected embodiments, the active maximum voltage switching circuit may include first and second cross-coupled PMOS transistors connected to receive first and second gate driving signals, where each cross-coupled PMOS transistor includes a gate connected to a drain of the other cross-coupled PMOS transistor, a drain tied to a gate of the other cross-coupled PMOS transistor, and a source connected to an output voltage node that is also coupled to an n-well for the cross-coupled PMOS transistor. In addition, the active maximum voltage switching circuit may include at least a first level shifter connected to receive the first selection signal and to generate a first level-shifted gate driving signal that is connected to the first or second power supply that is higher and where the second gate driving signal is connected to ground, wherein the first and second gate driving signals are connected, respectively, to the gates of the first and second cross-coupled PMOS transistors to pull a gate for one of the cross-coupled PMOS transistors to ground so that the higher of the first and second power supplies is coupled to the output voltage node over one of the first and second cross-coupled PMOS transistors, thereby generating the maximum bias voltage at the output voltage node. In addition, the first level shifter is connected to receive the comparator activation signal, and is configured to generate first and second level-shifted comparator activation signals. In addition, the gate driver circuit is connected to receive the first and second power supplies, and is configured to generate first and second PMOS gate control signals only in response to the first and second level-shifted comparator activation signals by using the first selection signal to generate first and second overlapping phase signals which control timing of the first and second PMOS gate control signals so that a ground voltage is supplied as the first PMOS gate control signal only after the maximum bias voltage is supplied as the second PMOS gate control signal. In selected embodiments, the gate driver circuit may include an overlapping phase generator for generating the first and second overlapping phase signals in response to the first selection signal. In addition, the gate driver circuit may include first and second OR gate driver circuits connected, respectively, to receive the first and second overlapping phase signals, where each of the first and second OR gate driver circuits is also connected to respond to the first and second level-shifted comparator activation signals so that the first and second overlapping phase signals activate one of the first and second PMOS gate control signals only after deactivating the other of the first and second PMOS gate control signals. In addition, the first and second PMOS power transistors connect the first and second power supplies, respectively, to a power supply output in response to the first or second PMOS gate control signals provided, respectively, to gate terminals of the first and second PMOS power transistors. In selected embodiments, each of the first and second PMOS power transistors include a source connected to a respective first or second power supply, a drain connected to the power supply output, and an n-well connected over the bias switching circuit to the maximum bias voltage only in response to the first and second level-shifted comparator activation signals. In addition, the bias switching circuit is connected to bias an n-well of each of the first and second PMOS power transistors to avoid forward biased junction diodes by connecting the n-well of each of the first and second PMOS power transistors to either the maximum bias voltage or one of the first and second power supplies in response to the first and second level-shifted comparator activation signals. In selected embodiments, the bias switching circuit includes first and second switches for connecting, respectively, the n-well of each of the first and second PMOS power transistors to the first and second power supplies when the first and second level-shifted comparator activation signals indicate that the comparator activation signal is not activated. In addition, the bias switching circuit may include a third switch for grounding the power supply output when the first and second PMOS power transistors are both OFF during power up to avoid charging the power supply output and prevent forward biased drain-to-bulk junction diodes.

In yet another form, there is provided a method and apparatus for controlling a dual power supply on an integrated circuit chip. In the disclosed methodology, first and second power supply voltages are received and compared at a comparator to generate a comparator activation signal when the comparator is ready to operate and to generate a first selection signal to identify which of the first and second power supply voltages is higher. In addition, the first and second power supply voltages are remapped into a maximum bias voltage which is the higher of the first and second power supply voltages. In selected embodiments, the first and second power supply voltages are remapped by comparing the first and second power supply voltages with the comparator to generate first and second selection signals identifying which of the first and second power supply voltages is higher; and then shifting the first and second selection signals with first and second level shifters to generate a first and second level-shifted gate control signals that are supplied as a first and second gate driving signals, respectively, to first and second gates of first and second cross-coupled PMOS transistors having an output voltage node connected in common to the sources and n-wells of the first and second cross-coupled PMOS transistors, thereby pulling a first gate of the first and second cross-coupled PMOS transistors to ground so that the higher of the first and second power supply voltages is coupled to the output voltage node over one of the first and second cross-coupled PMOS transistors, thereby generating the maximum bias voltage at the output voltage node. In addition, first and second PMOS gate control signals are generated in response to the comparator activation signal by using the first selection signal to generate first and second overlapping phase signals which control timing of the first and second PMOS gate control signals so that a ground voltage is supplied as the first power PMOS gate control signal only after the maximum bias voltage is supplied as the second PMOS gate control signal in response to the comparator activation signal. In selected embodiments, the first and second PMOS gate control signals are generated by generating, at a first level shifter, first and second level-shifted comparator activation signals from the comparator activation signal; and by supplying the first and second overlapping phase signals to first and second OR gate driver circuits which are each connected to receive one of the first and second level-shifted comparator activation signals so that the first and second OR gate driver circuits generate one of the first and second PMOS gate control signals only after deactivating the other of the first and second PMOS gate control signals. Finally, the first and second PMOS gate control signals are applied to gate terminals of first and second PMOS power transistors to connect the first and second power supply voltages, respectively, to a power supply output in response to the first or second PMOS gate control signals provided, respectively, to gate terminals of the first and second PMOS power transistors while biasing an n-well of each of the first and second PMOS power transistors to avoid forward biased junction diodes by connecting the n-well of each of the first and second PMOS power transistors to either the maximum bias voltage or one of the first and second power supply voltages in response to the comparator activation signal, thereby generating a maximum output supply voltage at the power supply output. In selected embodiments, the first and second PMOS power transistors each include a source connected to a respective first or second power supply voltage, a drain connected to the power supply output, and an n-well connected to the maximum bias voltage only in response to the comparator activation signal.

Although the described exemplary embodiments disclosed herein are directed to various active n-well switching circuits and methods for supplying a power supply rail to an n-well of a PMOS device, the present invention is not necessarily limited to the example embodiments which illustrate inventive aspects of the present invention that are applicable to a wide variety of circuits, processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power supply switching circuit, comprising:
a comparator connected to receive and compare first and second power supplies, where the comparator is configured to generate a comparator activation signal when the comparator is ready to operate, and is configured to generate a first selection signal identifying which of the first and second power supplies is higher; and
an active voltage switching circuit connected to receive the first and second power supplies and configured to generate therefrom a maximum bias voltage which is the higher of the first and second power supplies;
a gate driver circuit connected to receive the first and second power supplies and configured to generate first and second power supply selection signals only in response to the comparator activation signal by using the first selection signal to generate first and second overlapping phase signals which control timing of the first and second power supply selection signals so that a ground voltage is supplied as the first power supply selection signal only after the maximum bias voltage is supplied as the second power supply selection signal;
first and second PMOS power transistors for connecting the first and second power supplies, respectively, to a power supply output in response to the first or second power supply selection signals provided, respectively, to gate terminals of the first and second PMOS power transistors; and
a bias switching circuit connected to bias an n-well of each of the first and second PMOS power transistors to avoid forward biased junction diodes by connecting the n-well of each of the first and second PMOS power transistors to either the maximum bias voltage or one of the first and second power supplies in response to the comparator activation signal.

2. The power supply switching circuit of claim 1, where the comparator comprises:
a pre-amplification input stage comprising a differential-current-input, differential-current-output amplifier for generating first and second amplified signals;
a decision circuit stage comprising first and second cross-coupled NMOS transistors connected to determine which of the first and second amplified signals is larger and to generate a decision output signal; and
a gain stage connected to amplify the decision output signal and to generate the first selection signal identifying which of the first and second power supplies is higher.

3. The power supply switching circuit of claim 2, where the pre-amplification input stage comprises a bias amplification circuit for generating the comparator activation signal.

4. The power supply switching circuit of claim 1, where the active voltage switching circuit comprises:
first and second cross-coupled PMOS transistors connected to receive first and second gate driving signals, each cross-coupled PMOS transistor comprising:
a gate connected to a drain of the other cross-coupled PMOS transistor,
a drain tied to a gate of the other cross-coupled PMOS transistor, and
a source connected to an output voltage node that is also coupled to an n-well for the cross-coupled PMOS transistor; and
at least a first level shifter connected to receive the first selection signal and to generate a first level-shifted gate driving signal that is connected to the first or second power supply that is higher and where the second gate driving signal is connected to ground,
wherein the first and second gate driving signals are connected, respectively, to the gates of the first and second cross-coupled PMOS transistors to pull a gate for one of the cross-coupled PMOS transistors to ground so that the higher of the first and second power supplies is coupled to the output voltage node through one of the first and second cross-coupled PMOS transistors, thereby generating the maximum bias voltage at the output voltage node.

5. The power supply switching circuit of claim 1, where the gate driver circuit comprises:
an overlapping phase generator for generating the first and second overlapping phase signals in response to the first selection signal; and
first and second OR gate driver circuits connected, respectively, to receive the first and second overlapping phase signals, where each of the first and second OR gate driver circuits is also connected to respond to the comparator activation signal so that the first and second overlapping phase signals activate one of the first and second power selection supply signals only after deactivating the other of the first and second power selection supply signals.

6. The power supply switching circuit of claim 1, where the first and second PMOS power transistors each comprise a source connected to a respective first or second power supply, a drain connected to the power supply output, and an n-well connected over the bias switching circuit to the maximum bias voltage only in response to the comparator activation signal.

7. The power supply switching circuit of claim 1, where the bias switching circuit comprises first and second switches for connecting, respectively, the n-well of each of the first and second PMOS power transistors to the first and second power supplies when the comparator activation signal is not activated.

8. The power supply switching circuit of claim 1, where the bias switching circuit comprises a third switch for grounding the power supply output when the first and second PMOS power transistors are both OFF during power up to avoid charging the power supply output and prevent forward biased drain-to-bulk junction diodes.

9. A voltage switching circuit, comprising:
a comparator connected to receive first and second power supplies, where the comparator is configured to generate a comparator activation signal when the comparator is ready to operate and to generate a first selection signal identifying which of the first and second power supplies is higher;
an active maximum voltage switching circuit connected to receive the first and second power supplies, where the active maximum voltage switching circuit is configured to generate a maximum bias voltage which is the higher of the first and second power supplies;

a first level shifter connected to receive the comparator activation signal, where the first level shifter is configured to generate first and second level-shifted comparator activation signals;

a gate driver circuit connected to receive the first and second power supplies, where the gate driver circuit is configured to generate first and second PMOS gate control signals only in response to the first and second level-shifted comparator activation signals by using the first selection signal to generate first and second overlapping phase signals which control timing of the first and second PMOS gate control signals so that a ground voltage is supplied as the first PMOS gate control signal only after the maximum bias voltage is supplied as the second PMOS gate control signal;

first and second PMOS power transistors for connecting the first and second power supplies, respectively, to a power supply output in response to the first or second PMOS gate control signals provided, respectively, to gate terminals of the first and second PMOS power transistors; and a bias switching circuit connected to bias an n-well of each of the first and second PMOS power transistors to avoid forward biased junction diodes by connecting the n-well of each of the first and second PMOS power transistors to either the maximum bias voltage or one of the first and second power supplies in response to the first and second level-shifted comparator activation signals.

10. The voltage switching circuit of claim 9, where the comparator comprises:

a pre-amplification circuit connected to receive the first and second power supplies, where the pre-amplification circuit is configured as a differential-current-input, differential-current-output amplifier for generating first and second amplified signals;

a decision circuit connected to receive the first and second current signals, where the decision circuit is configured with cross-coupled NMOS transistors to determine which of the first and second current signals larger, and to generate one or more decision output voltage signals identifying which of the first and second power supplies is higher; and a gain circuit connected to receive the one or more decision output voltage signals, where the gain circuit is configured to generate the first selection signal identifying which of the first and second power supplies is higher.

11. The voltage switching circuit of claim 10, where the pre-amplification input circuit comprises a bias amplification circuit for generating the comparator activation signal when the bias amplification circuit generates a comparator bias current that is close to a final value.

12. The voltage switching circuit of claim 9, where the active maximum voltage switching circuit comprises: first and second cross-coupled PMOS transistors connected to receive first and second gate driving signals, each cross-coupled PMOS transistor comprising:

a gate connected to a drain of the other cross-coupled PMOS transistor, a drain tied to a gate of the other cross-coupled PMOS transistor, and a source connected to an output voltage node that is also coupled to an n-well for the cross-coupled PMOS transistor; and at least a first level shifter connected to receive the first selection signal and to generate a first level-shifted gate driving signal that is connected to the first or second power supply that is higher and where the second gate driving signal is connected to ground, wherein the first and second gate driving signals are connected, respectively, to the gates of the first and second cross-coupled PMOS transistors to pull a gate for one of the cross-coupled PMOS transistors to ground so that the higher of the first and second power supplies is coupled to the output voltage node through one of the first and second cross-coupled PMOS transistors, thereby generating the maximum bias voltage at the output voltage node.

13. The voltage switching circuit of claim 9, where the gate driver circuit comprises:

an overlapping phase generator for generating the first and second overlapping phase signals in response to the first selection signal; and first and second OR gate driver circuits connected, respectively, to receive the first and second overlapping phase signals, where each of the first and second OR gate driver circuits is also connected to respond to the first and second level-shifted comparator activation signals so that the first and second overlapping phase signals activate one of the first and second PMOS gate control signals only after deactivating the other of the first and second PMOS gate control signals.

14. The voltage switching circuit of claim 9, where the first and second PMOS power transistors each comprise a source connected to a respective first or second power supply, a drain connected to the power supply output, and an n-well connected over the bias switching circuit to the maximum bias voltage only in response to the first and second level-shifted comparator activation signals.

15. The voltage switching circuit of claim 9, where the bias switching circuit comprises first and second switches for connecting, respectively, the n-well of each of the first and second PMOS power transistors to the first and second power supplies when the first and second level-shifted comparator activation signals indicate that the comparator activation signal is not activated.

16. The voltage switching circuit of claim 9, where the bias switching circuit comprises a third switch for grounding the power supply output when the first and second PMOS power transistors are both OFF during power up to avoid charging the power supply output and prevent forward biased drain-to-bulk junction diodes.

17. A method of controlling a dual power supply on an integrated circuit chip, comprising:

receiving first and second power supply voltages;

comparing the first and second power supply voltage at a comparator to generate a comparator activation signal when the comparator is ready to operate;

generating a first selection signal at the comparator to identify which of the first and second power supply voltages is higher;

remapping the first and second power supply voltages into a maximum bias voltage which is the higher of the first and second power supply voltages;

generating first and second PMOS gate control signals in response to the comparator activation signal by using the first selection signal to generate first and second overlapping phase signals which control timing of the first and second PMOS gate control signals so that a ground voltage is supplied as the first power PMOS gate control signal only after the maximum bias voltage is supplied as the second PMOS gate control signal in response to the comparator activation signal; and applying the first and second PMOS gate control signals to gate terminals of first and second PMOS power transistors to connect the first and second power supply voltages, respectively, to a power supply output in response to the first or second PMOS gate control signals provided, respectively, to gate terminals of the first and second PMOS power transistors while biasing an n-well of each of the first and second PMOS power transistors to avoid forward biased junction diodes by connecting the n-well of each of the first and second PMOS power transistors to either the maximum bias voltage or one of the first and second power supply voltages in response to the comparator activation signal, thereby generating a maximum output supply voltage at the power supply output.

18. The method of claim 17, where remapping the first and second power supply voltages comprises:
comparing the first and second power supply voltages with a comparator to generate first and second selection signals identifying which of the first and second power supply voltages is higher;
shifting the first and second selection signals with first and second level shifters to generate a first and second level-shifted gate control signals that are supplied as a first and second gate driving signals, respectively, to first and second gates of first and second cross-coupled PMOS transistors having an output voltage node connected in common to the sources and n-wells of the first and second cross-coupled PMOS transistors, thereby pulling a first gate of the first and second cross-coupled PMOS transistors to ground so that the higher of the first and second power supply voltages is coupled to the output voltage node ever through one of the first and second cross-coupled PMOS transistors, thereby generating the maximum bias voltage at the output voltage node.

19. The method of claim 17, where generating first and second PMOS gate control signals comprises:
generating, at a first level shifter, first and second level-shifted comparator activation signals from the comparator activation signal;
supplying the first and second overlapping phase signals to first and second OR gate driver circuits which are each connected to receive one of the first and second level-shifted comparator activation signals so that the first and second OR gate driver circuits generate one of the first and second PMOS gate control signals only after deactivating the other of the first and second PMOS gate control signals.

20. The method of claim 17, where the first and second PMOS power transistors each comprise a source connected to a respective first or second power supply voltage, a drain connected to the power supply output, and an n-well connected to the maximum bias voltage only in response to the comparator activation signal.

* * * * *